United States Patent
Kitade et al.

(10) Patent No.: US 6,298,000 B1
(45) Date of Patent: *Oct. 2, 2001

(54) DYNAMIC TYPE SEMICONDUCTOR MEMORY DEVICE OPERABLE IN SELF REFRESH OPERATION MODE AND SELF REFRESH METHOD THEREOF

(75) Inventors: Osamu Kitade; Takahiro Komatsu, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1145 days.

(21) Appl. No.: 08/515,767

(22) Filed: Aug. 15, 1995

Related U.S. Application Data

(63) Continuation of application No. 08/200,615, filed on Feb. 23, 1994, now abandoned.

(30) Foreign Application Priority Data

Feb. 24, 1993 (JP) .................................................. 5-035161

(51) Int. Cl.$^7$ .................................................. G11C 11/00
(52) U.S. Cl. ...................................... 365/222; 365/189.07
(58) Field of Search .......................... 365/189.11, 189.07, 365/226, 222

(56) References Cited

U.S. PATENT DOCUMENTS

| 5,150,329 | * | 9/1992 | Hoshi | ................................ | 365/222 |
| 5,249,155 | * | 9/1993 | Arimoto et al. | ..................... | 365/222 |

FOREIGN PATENT DOCUMENTS

| 58-155598 | 9/1983 | (JP) . |
| 2-246088 | 10/1990 | (JP) . |
| 06-119780 | 4/1994 | (JP) . |

\* cited by examiner

Primary Examiner—A Zarabian
(74) Attorney, Agent, or Firm—McDermott, Will & Emery

(57) ABSTRACT

A power supply voltage detecting circuit detects whether or not a power supply voltage Vcc is a predetermined reference voltage level or more. The power supply voltage detecting circuit generates a self-refresh mode instruct signal φA to apply the same to a refresh timer when the power supply voltage detecting circuit determine that the power supply voltage Vcc is a predetermined voltage value or less. The refresh timer carries out a clocking operation in response to the self-refresh mode instruct signal φA to generate a self-refresh request signal φsrf at a predetermined time interval. A semiconductor memory device is implemented which can carry out the self-refresh mode easily without requiring a complicated timing condition of external signals.

23 Claims, 20 Drawing Sheets

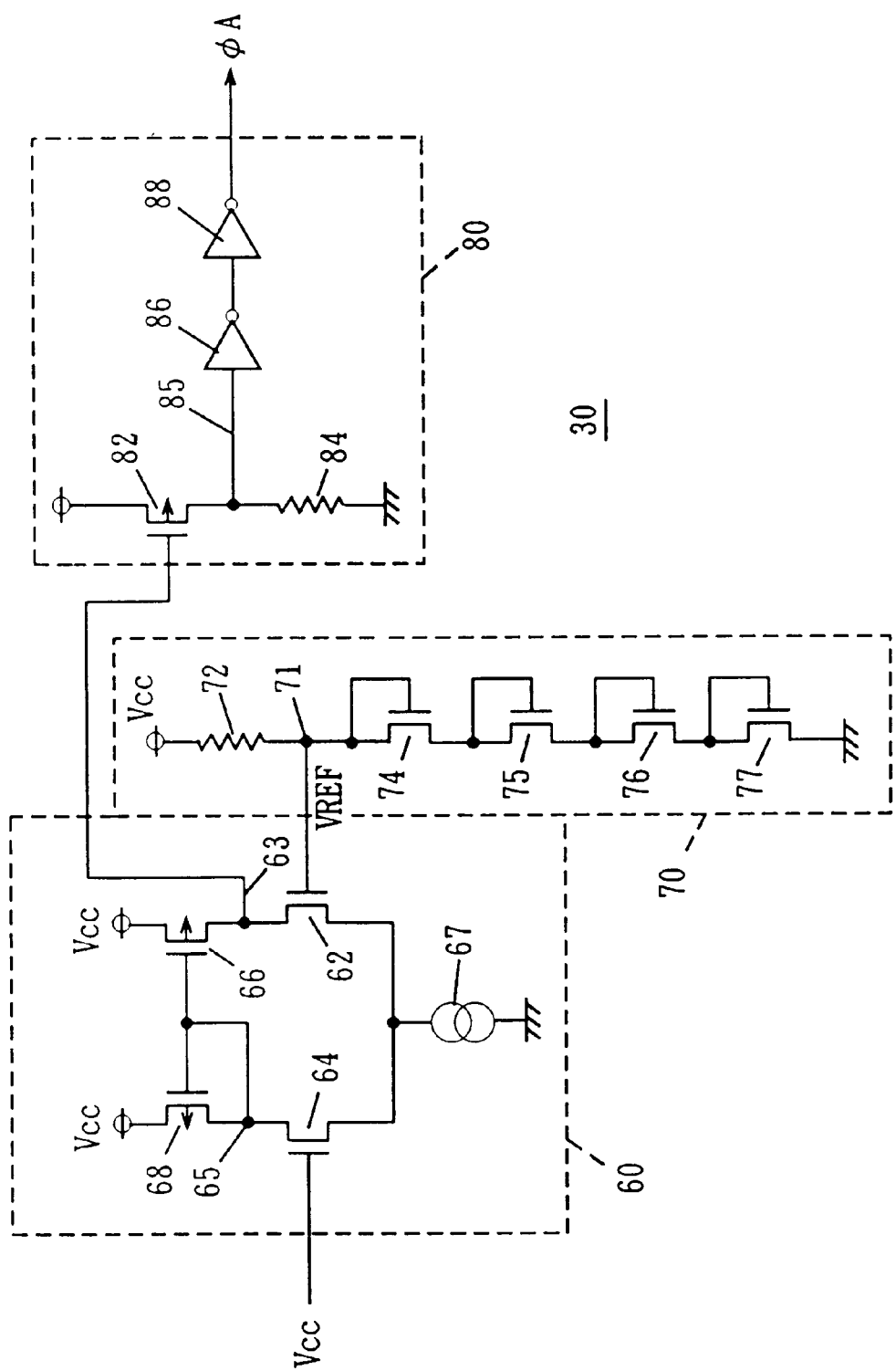

DYNAMIC TYPE SEMICONDUCTOR MEMORY DEVICE OPERABLE IN SELF REFRESH OPERATION MODE AND SELF REFRESH METHOD THEREOF

This application is a continuation of application Ser. No. 08/200,615 filed Feb. 23, 1994 abandoned Aug. 15, 1995.

BACKGROUND OF THE INVENTION

1. Field of the Invention

The present invention generally relates to a dynamic type semiconductor memory device, and more particularly, to a configuration for carrying out a refresh operation thereof.

2. Description of the Background Art

A memory cell in a dynamic type semiconductor memory device includes a capacitor, in which information is stored in a form of electric charges. In the dynamic type semiconductor memory device, in order to prevent destruction of storage data through leakage of electric charges inevitably caused in the memory cell capacitor, a refresh operation periodically restoring the storage data is carried out.

In the refresh operation, memory cells of one row in a memory cell array are brought into a selected state according to a refresh address, and data of the selected memory cells are sensed, amplified and restored. One of such refresh operation modes is called CBR refresh.

FIG. 30 is a signal waveform diagram showing operations in the CBR refresh mode. In the CBR refresh mode, a refresh instruction is set according to a CBR condition under which a signal /CAS (column address strobe) falls to an "L" level prior to falling of a signal /RAS (row address strobe). In response to falling of the signal /RAS, an internal control signal φRAS is generated. The internal control signal φRAS is a signal controlling circuitry (row decoder, sense amplifier and the like) relating to a row selecting operation in the memory device. Based on the internal control signal φRAS, memory cells of one row are selected and data are restored. A refresh operation which is first carried out under the CBR condition is usually called "CBR refresh".

Setting the signal /RAS to an "L" level for a predetermined period (for 100 μs as an example in FIG. 30) allows the CBR self refresh mode to be entered. A refresh request is generated by an internal timer at a predetermined time interval (16 μs as an example in FIG. 30). In response to the refresh request, the internal control signal φRAS is generated. According to the refresh request, the refresh address is generated from an internal address counter. The selecting operation of a row and the restoring operation according to the refresh address are carried out. The refresh mode carried out after a lapse of a predetermined period (for example, 100 μs) is usually called "CBR self-refresh".

The CBR refresh and the CBR self-refresh are usually called self-refresh mode.

In the self-refresh mode, refreshing is automatically carried out within the memory device if only external control signals /RAS and /CAS are placed under a predetermined condition. It is not necessary to apply an external control signal for each refresh cycle. Since the refresh address is also generated in the memory device, it is not necessary for a control device such as an external DRAM controller to operate. From the standpoint of power consumption as an entire system, the self-refresh mode is preferred.

Such a self-refresh mode is generally used in a battery backup operation or the like carrying out a data holding operation.

In an operating waveform diagram of the self-refresh mode shown in FIG. 30, the signal /CAS is set to an "L" level during the self-refresh mode period similar to the signal /RAS. After a self-refresh instruction, the signal /CAS may be maintained in an arbitrary state. This is because, in the self-refresh mode, the internal control signal φCAS controlling operations of circuitry relating to a column selecting operation is forcibly set to an "L" level of an inactive state while the signal /RAS is at an "L" level.

FIG. 31 is a diagram showing a simplified configuration of a general data processing system. In FIG. 31, the data processing system includes a central processing unit (CPU) 502 carrying out an operational processing according to a loaded program, a dynamic random access memory (DRAM) 506 serving as a main memory device of the data processing system, and a memory managing unit (MMU) 504 for managing access from CPU 502 to DRAM 506. MMU 504 carries out multiplexing of a row address and a column address to DRAM 506, generation of signals /RAS and /CAS, and the like.

The data processing system further includes a main power source 508, an auxiliary power source 510, and a power source switching circuit 512 selecting auxiliary power source 510 in place of main power source 508 when main power source 508 is in a power-off state and supplying a power supply voltage to CPU 502, MMU 504 and DRAM 506 from auxiliary power source 510. Main power source 508 may be a commercially available power source or a battery.

When main power source 508 is in a power-off state by the blackout or the like, power source switching circuit 512 is responsive to the power-off state for selecting the power supply voltage from auxiliary power source 510 to apply the same to respective units 502, 504 and 506. In response to the power-off state of main power source 508, CPU 502 has a process under execution interrupted and carries out necessary processings. After auxiliary power source 510 is selected by power source switching circuit 512, DRAM 506 enters a so called "battery backup operation mode". In this operation mode, according to an instruction from CPU 502, MMU 504 provides to DRAM 506 an instruction of self-refresh mode according to, for example, the CBR condition. In the meantime, only the data holding operation is carried out in DRAM 506.

Power source switching circuit 512 monitors only power-on/power-off of main power source 508 and carries out switching of power sources according to the monitor result. In the case where main power source 508 is a commercially available power source, numerous devices/apparatuses using the commercially available power source simultaneously operate, sometimes causing a voltage level of main power source 508 to be decreased temporarily. In this case, since power source switching circuit 512 does not detect a power-off state, power source switching circuit 512 does not switch power sources, and selects main power source 508. Since processings are carried out in the data processing system using the decreased power supply voltage, the system malfunctions because of decrease of a signal timing margin or the like.

In this case, it is also necessary to reduce power consumption of the data processing system and to promote recovery of main power source 508 to the power supply voltage level. However, in the conventional data processing system, even if the voltage level of main power source 508 was temporarily decreased, the data processing according to the program was carried out with no special processing being carried out, which partly delayed recovery of the voltage level of main power source 508.

When the power supply voltage is lowered, a data holding characteristic of memory cells in DRAM 506 is deteriorated. More specifically, as compared to the case where the power supply voltage is normal, data held by a memory cell disappears in a shorter time. However, in the conventional semiconductor memory device, a configuration is not provided which refreshes the memory cell data positively when the level of the power supply voltage is lowered. Therefore, accurate holding of data is not ensured.

When the self-refresh operation is designated, it is necessary to meet the CBR condition or the like in the conventional configuration. In this case, it is necessary to drive a plurality of control signals. As a result, many circuits operate, which makes it impossible to reduce power consumption.

For the self-refreshing operation, it is also necessary to carry out a complicated timing setting of CBR condition for external control signals.

SUMMARY OF THE INVENTION

An object of the present invention is to provide a dynamic type semiconductor memory device which can operate with low power consumption.

Another object of the present invention is to provide a dynamic type semiconductor memory device which can easily enter a self-refresh mode without necessitating a complicated timing condition of external signals.

A still another object of the present invention is to provide a dynamic type semiconductor memory device which can accurately hold data even when a power supply voltage is lowered.

The dynamic type semiconductor memory device according to the present invention is, in brief, adapted to enter the self-refresh mode automatically when the power supply voltage is lowered.

More specifically, the dynamic type semiconductor memory device of the present invention includes voltage level detecting circuitry detecting a power supply voltage level, self-refresh instructing circuitry generating a self-refresh mode instruct signal when the voltage level detecting circuitry detects the power supply voltage being a predetermined level or less, and timer circuitry carrying out a clocking operation for providing a timing at which a refresh operation is carried out in response to the self-refresh mode instruct signal.

In the present invention, the self-refresh mode operation is automatically entered in response to the power supply voltage level. Therefore, it is possible to easily enter the self-refresh mode operation with low power consumption without necessitating the complicated timing condition of the external control signals.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing a configuration of a second embodiment of the power supply voltage detecting circuit shown in FIG. 1.

DESCRIPTION OF THE PREFERRED EMBODIMENT

[The Entire Configuration]

Figure 1:
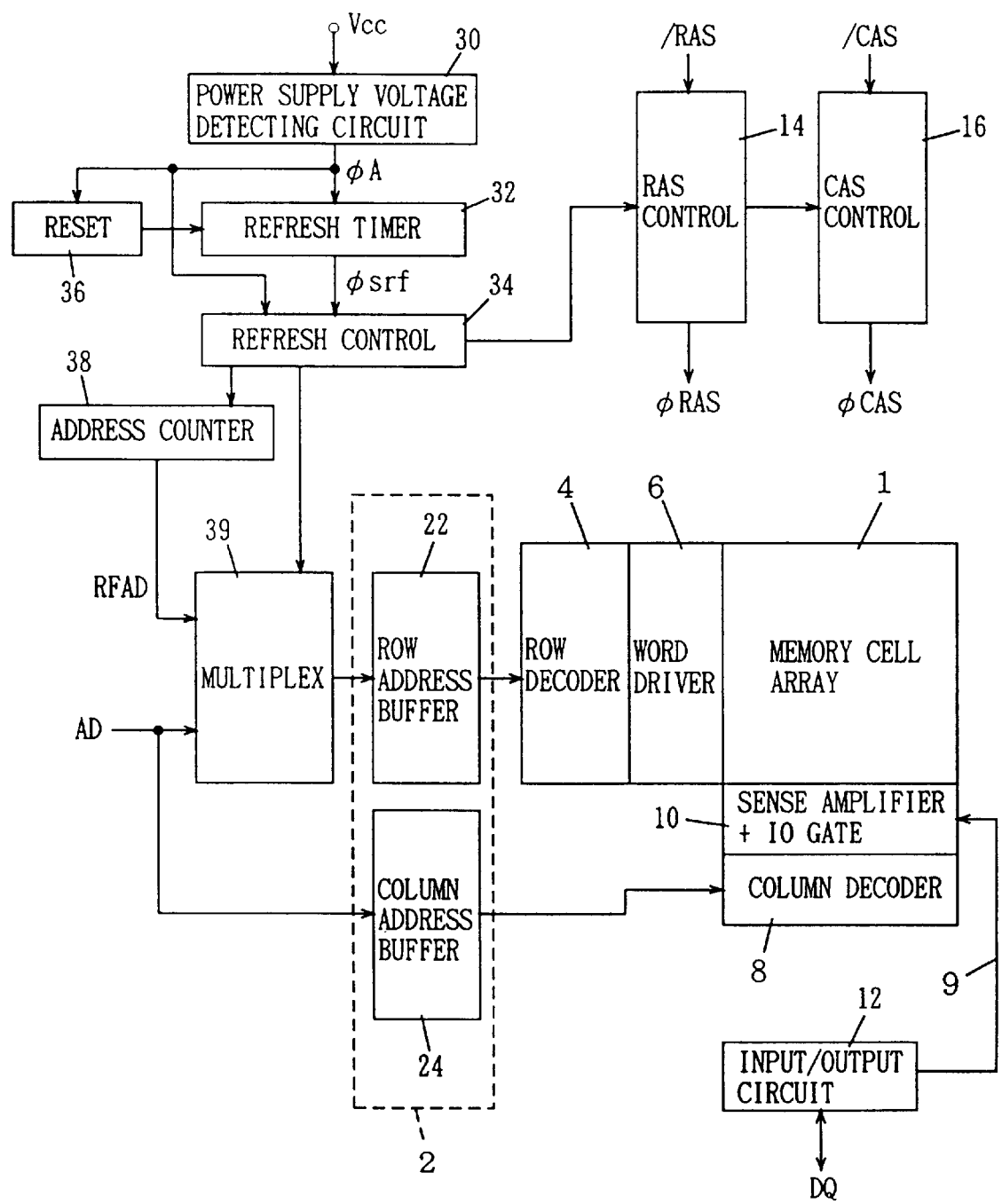
FIG. 1 is a diagram showing the entire configuration of a dynamic type semiconductor memory device according to one embodiment of the present invention.

FIG. 1 is a diagram showing the entire configuration of the dynamic type semiconductor memory device to which the present invention is applied. In FIG. 1, a dynamic random access memory (hereinafter referred to as "DRAM") is shown as an example of the dynamic type semiconductor memory device. The present invention can also be applied to memory devices such as a pseudo SRAM (PSRAM) or a virtual SRAM (VSRAM) in which data of memory cells must be refreshed.

Referring to FIG. 1, the DRAM includes a memory cell array 1 including a plurality of dynamic memory cells disposed in rows and columns, an address buffer 2 generating an internal row address signal and an internal column address signal, a row decoder 4 decoding the internal row address signal from address buffer 2 to generate a signal selecting a corresponding row (word line) of memory cell array 1, a word driver 6 responsive to a row select signal from row decoder 4 to transmit a select signal onto a corresponding row (word line) of memory cell array 1, and a column decoder 8 decoding the internal column address signal from address buffer 2 to select a corresponding column (bit line pair) of memory cell array 1. Address buffer 2 includes a row address buffer 22 for generating an internal row address signal, and a column address buffer 24 for generating an internal column address signal.

The DRAM further includes a sense amplifier sensing and amplifying data of a memory cell connected to a row selected by row decoder 4 of memory cell array 1, and an IO gate connecting a column selected by column decoder 8 to an internal data bus 9. In FIG. 1, the sense amplifier and the IO gate are shown in one block 10. Internal data bus 9 is connected to an input/output circuit 12 for carrying out input/output of data to and from the outside of the device.

The DRAM further includes a RAS control circuit 14 responsive to a row address strobe signal /RAS for generating an internal control signal φRAS, and a CAS control circuit 16 responsive to a column address strobe signal /CAS for generating an internal control signal φCAS. The internal control signal φRAS is used for driving row address buffer 22, row decoder 4, word driver 6, the sense amplifier and the like. The internal control signal φCAS is used for driving column address buffer 24, column decoder 8, and input/output circuit 12.

Input/output circuit 12 carries out input or output of data in response to the signal /CAS and a write enable signal /WE, not shown. Input/output circuit 12 is shown carrying out writing and reading of data through a common node DQ. It may be structured so that input and output of the data are carried out through separate pin terminals. RAS control circuit 14 sets CAS control circuit 16 to an operable state when the signal /RAS attains an "L" level of an active state. When the signal /RAS is at an "H" level of an inactive state, CAS control circuit 16 is brought into a non-operable state, and the internal control signal φCAS is held at an "L" level.

As a refresh control system, the DRAM includes a power supply voltage detecting circuit 30 detecting a level of a power supply voltage Vcc and generating a self-refresh mode instruct signal φA according to the detected level, a refresh timer 32 carrying out a clocking operation in response to the self-refresh mode instruct signal φA from power supply voltage detecting circuit 30 and generating a self-refresh request signal φsrf at a predetermined time interval after a lapse of a predetermined time, a refresh control circuit 34 generating a control signal required for refreshing in response to the self-refresh request signal φsrf from refresh timer 32 and the self-refresh mode instruct signal φA from power supply voltage detecting circuit 30, a reset circuit 36 resetting refresh timer 32 in response to transition of the self-refresh mode instruct signal φA from power supply voltage detecting circuit 30 into an active state, an address counter 38 generating a refresh address RFAD designating a refresh row under control of refresh control circuit 34, and a multiplex circuit 39 selecting one of the refresh address RFAD from address counter 38 or an external address AD under control of refresh control circuit 34 and applying the selected address to row address buffer 22.

Refresh control circuit 34 generates a one-shot pulse signal in response to the self-refresh request signal φsrf to apply the same to RAS control circuit 14. The one-shot pulse signal generated by refresh control circuit 34 has a time width required for refreshing of a memory cell data. Refresh control circuit 34 increases or decreases a count value of address counter 38 by one at the time of completion of one refresh cycle. Under control of refresh control circuit 34, multiplex circuit 39 selects the refresh address RFAD from address counter 38 in the self-refresh mode and applies the selected address to row address buffer 22. In the normal operation, multiplex circuit 39 selects the externally applied address signal AD to apply the same to row address buffer 22. Description will now be given of the operation briefly.

In a normal operation, the power supply voltage Vcc has a normal value, and the signal φA from power supply voltage detecting circuit 30 is in an inactive state. In this state, refresh timer 32 is not activated. RAS control circuit 14 and CAS control circuit 16 generate the internal control signals φRAS and φCAS in response to the signals /RAS and /CAS, respectively. Multiplex circuit 39 is in a state where the external address signal AD is selected. In address buffer 2, row address buffer 22 and column address buffer 24 strobe into a row address and a column address applied in a time division multiplexed manner, respectively, to generate an internal row address signal and an internal column address signal, respectively. Operation timings of row address buffer 22 and column address buffer 24 are determined by the internal control signals φRAS and φCAS.

Row decoder 4 decodes the internal row address signal from row address buffer 22 to generate a row select signal. Word driver 6 drives a corresponding row of memory cell array 1 into a selected state in response to the row select signal from row decoder 4. Then, a sense amplifier included in block 10 senses and amplifies data of a memory cell connected to the selected one row. Column decoder 8 decodes the internal column address signal from column address buffer 24 to generate a column select signal for selecting a corresponding column of memory cell array 1.

The IO gate included in block 10 connects the corresponding column in memory cell array 1 to internal data bus 9 in response to the column select signal from column decoder 8. In this state, reading or writing of data is carried out through input/output circuit 12. It is determined by the write enable signal /WE, not shown, which of reading and writing of data is carried out.

Figure 2:
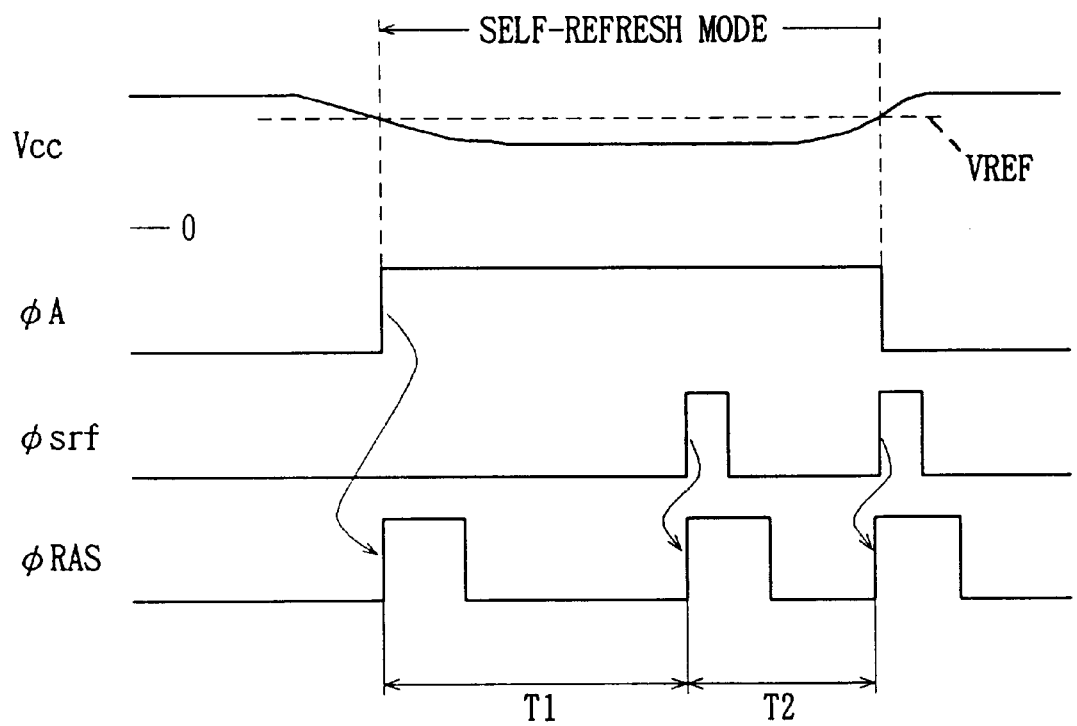
FIG. 2 is a diagram showing schematically operations of the dynamic type semiconductor memory device according to the present invention.

When the power supply voltage Vcc is lower than a predetermined voltage level VREF, as shown in the operating waveform diagram of FIG. 2, the signal φA from power supply voltage detecting circuit 30 is brought into an active state, and the self-refresh mode is designated. The reference voltage VREF serving as a criterion used by power supply voltage detecting circuit 30 is set to, for example, 4.5V, when the operational power supply voltage Vcc in the normal state is 5V. In response to the self-refresh mode instruct signal, refresh timer 32 is activated. Refresh control circuit 34 sets multiplex circuit 39 to a state where the refresh address RFAD from address counter is selected in response to the self-refresh mode instruct signal φA.

At this time, refresh control circuit 34 generates the one-shot pulse signal again in response to the self-refresh mode instruct signal φA to apply the pulse signal to RAS control circuit 14. In response to this, the internal control signal φRAS is generated from RAS control circuit 14. At this time, the operation of CAS control circuit 16 is inhibited, and the internal control signal φCAS is brought into an "L" level of an inactive state. In response to the internal control signal φRAS, row address buffer 22 incorporates the refresh address signal RFAD applied from multiplex circuit 39 to apply the same to row decoder 4. Row decoder 4 decodes the refresh address signal from row address buffer 22 to generate a refresh row select signal designating a row to be refreshed in memory cell array 1. Word driver 6 drives a corresponding row into a selected state in response to the refresh row select signal.

Then, in response to the internal control signal φRAS, the sense amplifier is activated, and sensing, amplification and restoring of memory cell data connected to the selected row are carried out. Since the internal control signal φCAS is in an inactive state, column address buffer 24 and column decoder 8 do not operate, and column selection in memory cell array 1 is not carried out. After a lapse of a predetermined time (which is determined by a pulse width of the internal control signal φRAS generated at the time of refreshing), the output of row decoder 4 falls to an "L" level. The output of word driver 6 also falls to an "L" level, and refreshing of data of memory cells of one row in memory cell array 1 is completed.

While the refresh mode instruct signal φA is in an active state, refresh timer 32 carries out the clocking operation. After a lapse of a predetermined time, the refresh request signal φsrf from refresh timer 32 rises to an active state. In response to this, refresh control circuit 34 generates a one-shot pulse signal to apply the same to RAS control circuit 14. As a result, the refreshing operation is again carried out. This operation is repeatedly carried out while the self-refresh mode instruct signal φA is in an active state. At the time of completion of each refresh cycle, the count value of address counter 38 is increased or decreased by one, and the address counter is brought into a state where a refresh row in the next refresh cycle is designated.

In the operating waveform diagram shown in FIG. 2, a period T1 from the time when the self-refresh mode instruct signal φA attains an "H" level of an active state to the time when self-refreshing is carried out, and a period T2 during which refreshing is continuously carried out in the self-refresh mode are respectively made shorter than specification values thereof when the power supply voltage Vcc is normal. This is because a data holding characteristic of the memory cell is deteriorated when the power supply voltage Vcc is lowered, whereby the held data disappears earlier.

With structure as described above, it is possible to automatically carried out refreshing of memory cell data when the power supply voltage Vcc is lowered. In this case, without any combination of timing conditions of the signals /RAS and /CAS, is used, the self-refresh mode can be easily entered. Generation of the signal φCAS in response to rising of the signal φA may be inhibited.

Configuration of Each Portion

[Power Supply Voltage Detecting Circuit]

Figure 3A:
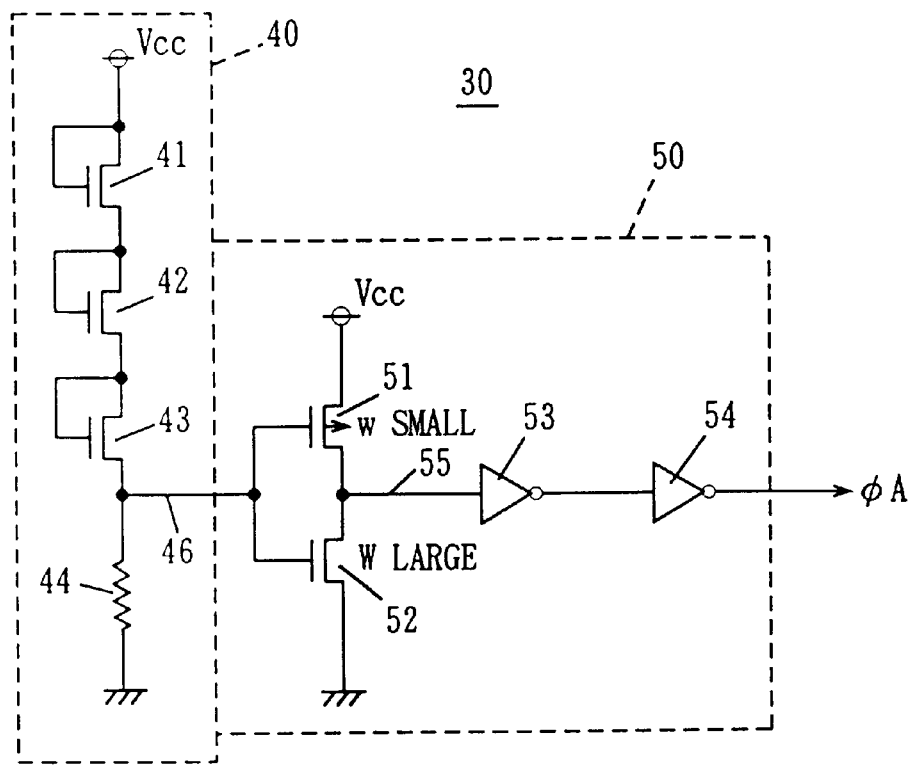
FIGS. 3A and 3B are diagrams showing the specific configuration and operation of a power supply voltage detecting circuit shown in FIG. 1, respectively.
Figure 3B:
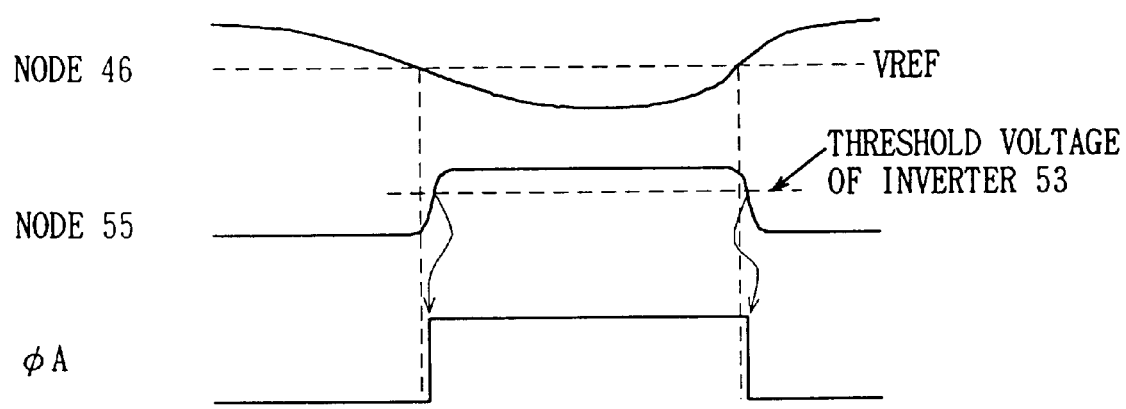

FIG. 3A is a diagram showing the configuration of the first embodiment of the power supply voltage detecting circuit shown in FIG. 1. In FIG. 3A, a power supply voltage detecting circuit 30 includes a level detecting circuit 40 detecting a level of the power supply voltage vcc, and a self-refresh instructing circuit 50 generating the self-refresh mode instruct signal φA according to the output (detected voltage) of level detecting circuit 40. Level detecting circuit 40 includes a plurality of (three in FIG. 3) diode-connected n channel MOS (insulating gate type field effect) transistors 41, 42 and 43 connected in series between a power supply voltage Vcc supply node and an output node 46, and a resistance element 44 of a high resistance value provided between output node 46 and the ground potential supply node.

Since resistance element 44 has a sufficiently large resistance value, n channel MOS transistors 41 to 43 serve as diodes, and provide a voltage drop of 3.Vth. Vth is a threshold voltage of respective transistors 41 to 43. Therefore, a voltage which appears on output node 46 is Vcc−3·Vth.

Self-refresh instructing circuit 50 includes complementary-connected p channel MOS transistor 51 and n channel MOS transistor 52 receiving the output voltage of output node 46 of level detecting circuit 40 at their gates, and inverter circuits 53 and 54 inverting and amplifying a potential on a node 55. The gate width W of p channel MOS transistor 51 is made sufficiently smaller than the gate width W of n channel MOS transistor 52. Transistors 51 and 52 configure an inverter circuit. By adjusting the gate width of transistors 51 and 52, it is possible to set the input threshold voltage of the inverter (configured of transistors 51 and 52) to a predetermined value. The input threshold voltage of the inverter configured of transistors 51 and 52 provides the above-described reference voltage VREF.

The gate width W of transistor 51 is made smaller than the gate width W of transistor 52. Therefore, a current supplying ability of transistor 51 is smaller than a current driving ability of transistor 52. As a result, the input logical threshold voltage of the inverter circuit configured of transistors 51 and 52 takes a substantially low value. Description will now be given of the operation with reference to FIG. 3B, which is the operating waveform diagram.

In the normal operation, the power supply voltage Vcc is at a level of, for example, 5V, and the voltage level provided from node 46 is approximately 2V. It is assumed that the threshold voltage Vth of transistors 41 to 43 is 1V. The input logical threshold value VREF of the inverter circuit configured of transistors 51 and 52 is set to, for example, 1.5V, which is smaller than 2V. In this state, even if the gate-to source voltage of transistor 51 is lower than the threshold voltage of transistor 51, the current supplying ability is smaller than that of transistor 52. Therefore, the potential of node 55 is discharged to the ground potential level by transistor 52 to attain an "L" level.

When the power supply voltage Vcc is lowered, the potential of node 46 is accordingly decreased. In response to this, transistor 51 is brought into an on state more strongly, while transistor 52 makes transition to an off state. When transistor 52 makes transition to an off state, the driving ability of node 55 of transistor 52 is made smaller than that of transistor 51, and node 55 is charged by transistor 51 to have its potential increased. Inverter 53 inverts and amplifies the potential of node 55. More specifically, when the potential of node 55 is made higher than the input logical threshold of inverter 53, the output of inverter 53 falls to an "L" level at a high speed to be further inverted and amplified by inverter 54. As a result, the self-refresh instruct signal φA rises to an "H" level at a high speed.

When the power supply voltage Vcc recovers to a predetermined voltage level or more, the potential of node 46 is accordingly increased. In this case, transistor 51 makes transition to an off state, and discharging of node 55 of transistor 52 is more enhanced than charging of the potential of node 55. As a result, node 55 is discharged through transistor 52. When the potential of node 55 is lower than the input logical threshold of inverter circuit 53, the output of inverter circuit 53 rises to an "H" level, and the self-refresh mode instruct signal φA falls to an "L" level at a high speed.

As described above, by detecting the potential of output node 46 of level detecting circuit 40 by an inverter having its input logical threshold set to an appropriate value, and then amplifying the potential by inverter circuits 53 and 54, it is possible to easily generate the self-refresh mode instruct signal according to the power supply voltage level accurately.

FIG. 4 is a diagram showing the configuration of the second embodiment of the power supply voltage detecting circuit. In FIG. 4, power supply voltage detecting circuit 30 includes a reference voltage generating circuit 70 generating a predetermined reference voltage VREF, a comparing circuit 60 comparing the reference voltage VREF with the power supply voltage Vcc, and a signal generating circuit 80 generating the self-refresh mode instruct signal φA in response to the output of comparing circuit 60. Reference voltage generating circuit 70 and comparing circuit 60 serve as level detecting means.

Reference voltage generating circuit 70 includes a resistance element 72 of a high resistance value provided between a power supply node supplying the power supply voltage Vcc and an output node 71, and n channel MOS transistors 74, 75, 76 and 77 each diode-connected and connected in series between output node 71 and a node supplying the ground potential. Transistors 74 to 77 respectively provide a voltage drop by the threshold voltage Vth. Therefore, the voltage of 4.Vth is generated from output node 71 of reference voltage generating circuit 70 as the reference voltage VREF. It should be noted that the voltage 4.Vth is generated when the power supply voltage Vcc is higher than 4.Vth. When the power supply voltage Vcc is lower than the reference voltage 4.Vth, any of transistors 74 to 77 is brought into an off state. The reference voltage VREF generated by reference voltage generating circuit 70 is pulled up by a resistance element 72 to assume the same value as the power supply voltage Vcc.

Comparing circuit 60 includes an n channel MOS transistor 62 receiving the reference voltage VREF from reference voltage generating circuit 70 at its gate, and an n channel MOS transistor 64 receiving the power supply voltage Vcc at its gate. Transistors 62 and 64 have their one conduction terminals (sources) connected to a constant current source 67.

Comparing circuit 60 further includes p channel MOS transistors 66 and 68 for supplying current to transistors 62 and 64, respectively. Gates of transistors 66 and 68 are connected together to a node 65, transistor 68 serves as a diode, and transistors 66 and 68 constitute a current mirror circuit. When transistors 66 and 68 have the same size, the same amount of current flows in transistors 66 and 68.

Signal generating circuit 80 includes a p channel MOS transistor 82 receiving a signal on output node 63 of comparing circuit 60 at its gate, a resistance 84 having a current supplied from transistor 82 and generating a voltage according to the amount of supplied current, and two-stage inverter circuits 86, 88 receiving a signal on a connection node 85 between transistor 82 and resistance 84. The operation will now be described.

When the power supply voltage Vcc is higher than the reference voltage 4.Vth applied by transistors 74 to 77, the reference voltage VREF generated from reference voltage generating circuit 70 is 4.Vth. In this state, since the power supply voltage Vcc is higher than the reference voltage VREF, transistor 64 has a conductance larger than that of transistor 62, causing more current to flow therethrough. The current is supplied to transistor 64 through transistor 68. Since the conductance of transistor 64 is made larger, the potential of node 65 is lowered, and a current flowing in transistor 68 increases. The same amount of current as that of transistor 68 flows in transistor 66 (in the case where transistor 66 and 68 have the same size). Therefore, since more current than transistor 62 can conduct is supplied through transistor 66, the potential of node 63 is increased.

In signal generating circuit 80, the signal potential of output node 63 of comparing circuit 60 is applied to the gate of transistor 82. Transistor 82 supplies an amount of current according to the gate potential. When the potential of node 63 is at a high level, the amount of current flowing through transistor 82 is small, and the voltage generated by resistance 84 is a low voltage. The maximum potential of node 63 is Vcc−Vth (66). Vth (66) here is a threshold voltage of transistor 66. In this state, transistor 82 is in a slight on state, supplying a small amount of current. In this state, inverter circuit 86 determines that the potential of node 85 is at an "L" level to generate a signal of an "H" level. The signal is further inverted and amplified by inverter 88, and the signal φA is at an "L" level.

When the power supply voltage Vcc is a predetermined reference voltage 4.Vth or less, the output voltage VREF of reference voltage generating circuit 70 becomes equal to the power supply voltage Vcc. In this state, transistors 62 and 64 have the same conductance, and approximately the same amount of current flows in transistors 62 and 64. In this state, node 63 is discharged by transistor 62, and attains a voltage level lower than in the normal operation. In response to this, transistor 82 included in signal generating circuit 80 is brought into a strong on state, supplying more current. As a result, the voltage level generated by resistance 84 increases, the signal potential level on node 85 is determined to be an "H" level by inverter circuit 86, and the signal φA rises to an "H" level. Inverter circuit 86 has a CMOS configuration in which gate length of the p channel transistor and that of the n channel MOS transistor have values different from each other, and the input logical threshold is adjusted to an appropriate value.

In the configuration shown in FIG. 4, since the power supply voltage Vcc and the reference voltage VREF are compared and differentially amplified using a current mirror type differential amplifier, it is possible to determine the power supply voltage level more accurately and generate the self-refresh mode instruct signal φA.

Figure 5:
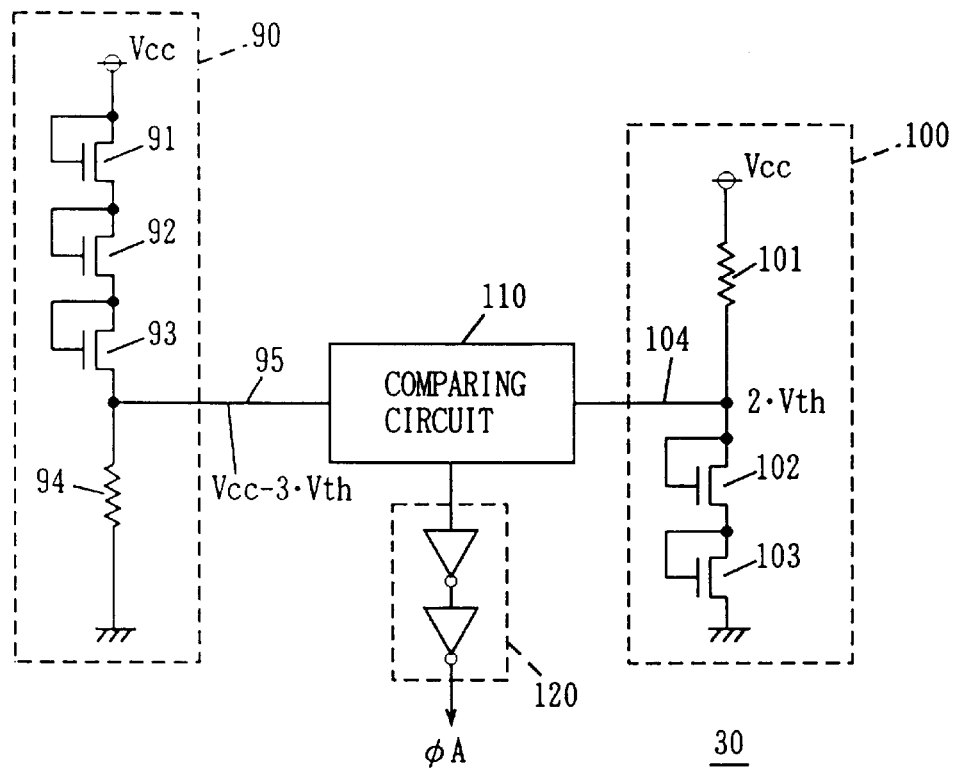
FIG. 5 is a diagram showing a configuration of a third embodiment of the power supply voltage detecting circuit shown in FIG. 1.

FIG. 5 is a diagram showing the configuration of the third embodiment of the power supply voltage detecting circuit. In FIG. 5, power supply voltage detecting circuit 30 includes a level detecting circuit 90 for detecting a level of the power supply voltage, a reference voltage generating circuit 100 generating the reference voltage, a comparing circuit 110 comparing the output of level detecting circuit 90 and the reference voltage provided by reference voltage generating circuit 100, and an amplifying circuit 120 amplifying an output signal of comparing circuit 110.

Level detecting circuit 90 includes n channel MOS transistors 91, 92 and 93 each diode-connected and connected in series between the power supply voltage Vcc supply node and an output node 95, and a resistor element 94 of a high resistance connected between output node 95 and the ground potential supply node. The voltage Vcc−3.Vth is generated from the level detecting circuit 90. Vth is a threshold voltage of each of transistors 91 to 93.

Reference voltage generating circuit 100 includes a resistor element 101 of a high resistance provided between the power supply voltage supply node and an output node 104, and n channel MOS transistors 102 and 103 each diode-connected and connected in series between output node 104 and the ground potential supply node. The reference voltage of 2.Vth is generated from reference voltage generating circuit 100.

Comparing circuit 110 compares the voltage Vcc−3.Vth on output node 95 of level detecting circuit 90 with the reference voltage 2.Vth generated by reference voltage generating circuit 100. Comparing circuit 110 provides a signal of a high level when Vcc−3.Vth≦2.Vth. Comparing circuit 110 may have a configuration of the current mirror type differential amplifier shown in FIG. 4. Comparing circuit 110 may also have other configurations. Amplifying circuit 120 includes 2-stage inverters, and amplifies the output of comparing circuit 110 to generate the self-refresh mode instruct signal φA.

In the case of the configuration shown in FIG. 5, the reference voltage 2.Vth generated by reference voltage generating circuit 100 is a relatively low voltage. When Vth=0.9 (V), even if the power supply voltage Vcc decreases from 5V to 3V, transistors 102, 103 are in an on state, and can generate a constant reference voltage stably. The voltage signal level provided by level detecting circuit 90 is approximately 5−3.0.9=2.3V, when Vcc=5V, in the normal operation. The reference voltage 2.Vth generated by reference voltage generating circuit 100 is approximately 1.8V. When the power supply voltage Vcc is decreased to approximately 4V, the voltage provided by level detecting circuit 90 becomes 4−2.7=1.3V, approximately. Therefore, it is possible to set the self-refresh mode according to decrease of the power supply voltage Vcc reliably.

Figure 6:
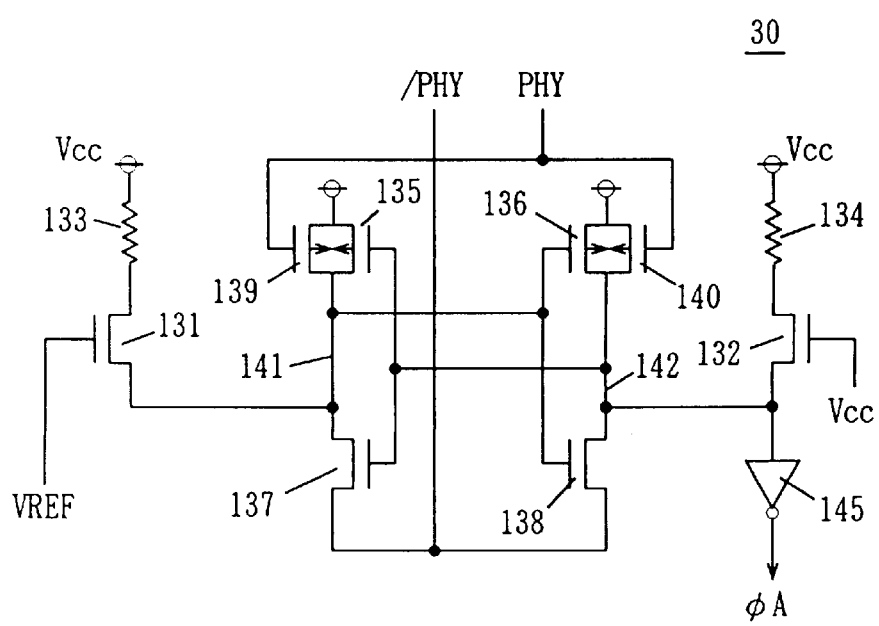
FIG. 6 is a diagram showing a configuration of a fourth embodiment of the power supply voltage detecting circuit shown in FIG. 1.

FIG. 6 is a diagram showing the configuration of the fourth embodiment of the power supply voltage detecting circuit. In FIG. 6, power supply voltage detecting circuit 30 includes an n channel MOS transistor 131 receiving the reference voltage VREF at its gate, an n channel MOS transistor 132 receiving the power supply voltage Vcc at its gate, load resistances 133 and 134 of a high resistance for pulling up the potential of one conduction terminal of each of transistors 131 and 132 to the power supply voltage Vcc level, a p channel MOS transistor 136 and an n channel MOS transistor 138 configuring an inverter for inverting the potential on the other conduction terminal (node 141) of transistor 131, and a p channel MOS transistor 135 and an n channel MOS transistor 137 configuring an inverter circuit for inverting the potential on the other conduction terminal (node 142) of transistor 132.

The output node (node 141) of the inverter circuit configured of transistors 135 and 137 is connected to the gate of transistors 136 and 138. The output node (node 142) of the inverter circuit configured of transistors 136 and 138 is connected to the gate of transistors 135 and 137.

Power supply voltage detecting circuit 30 further includes p channel MOS transistors 139 and 140 provided in parallel with transistors 135 and 136, respectively, and receiving a control signal PHY at their gates. An inverted control signal /PHY is applied to the other conduction terminals (sources) of transistors 137 and 138. Node 142 is connected to the input of inverter circuit 145. The self-refresh mode instruct signal φA is generated from inverter circuit 145. The operation will now be described with reference to FIGS. 7A and 7B, which are the operating waveform diagrams.

Figure 7A:
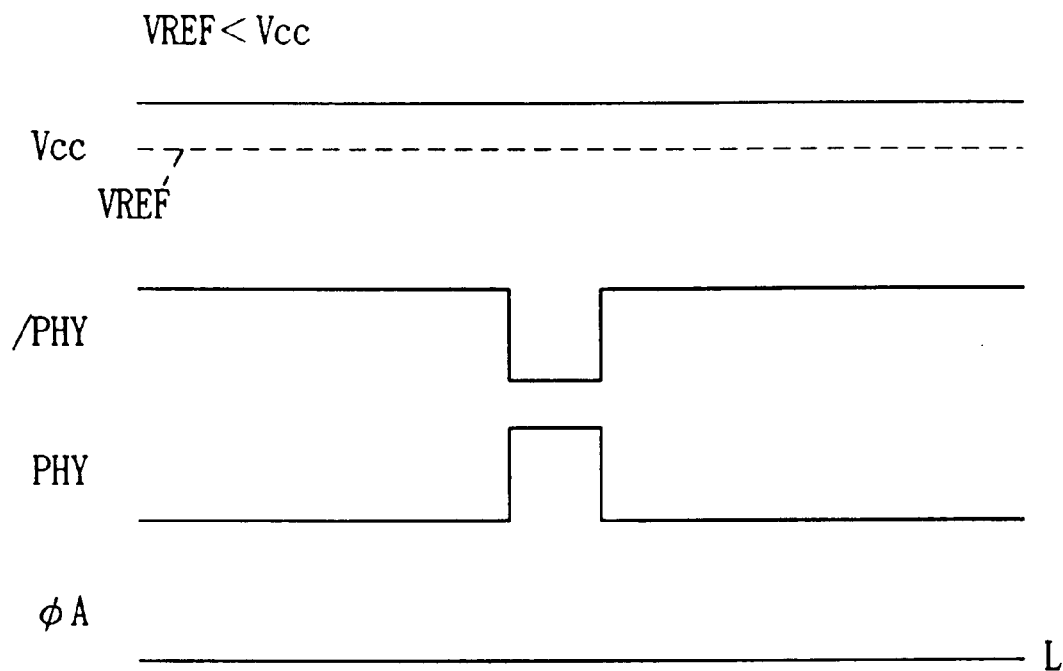
FIGS. 7A and 7B are signal waveform diagrams showing the operation of the power supply voltage detecting circuit shown in FIG. 6.

Referring to FIG. 7A, description will be given of the operation in the case where the power supply voltage Vcc is higher than the reference voltage VREF. When the control signals PHY and /PHY are at an "L" level and an "H" level, respectively, transistors 139 and 130 are rendered conductive, while transistors 137 and 138 are in an off state. In this state, both nodes 141 and 142 are charged to the power supply voltage Vcc level through transistors 139 and 140. In this state, the output of inverter circuit 145 is at an "L" level.

When the control signals PHY and /PHY are set to an "H" level and an "L" level, respectively, transistors 139 and 140 are brought into an off state, and the precharge state of nodes 141 and 142 is completed. Since the power supply voltage Vcc is now higher than the reference voltage VREF, the conductance of transistor 132 is larger than that of transistor 131, and the potential of node 142 is higher than that of node 141. Depending on the potential of node 142, transistor 137 makes transition to a conductive state, and discharges node 141 to the ground potential level (at "L" level of the signal /PHY). With the decrease of the potential of node 141, transistor 136 makes transition to a conductive state, and increases the potential of node 142 up to the power supply voltage Vcc level.

With the potential decrease of node 141 and the potential increase of node 142, the latch state of an inverter latch circuit configured of transistors 135, 137, 136 and 138 is established, and the potential level of node 142 increases up to the power supply voltage Vcc level. As a result, the output φA of inverter circuit 145 maintains the state of an "L" level.

Figure 7B:
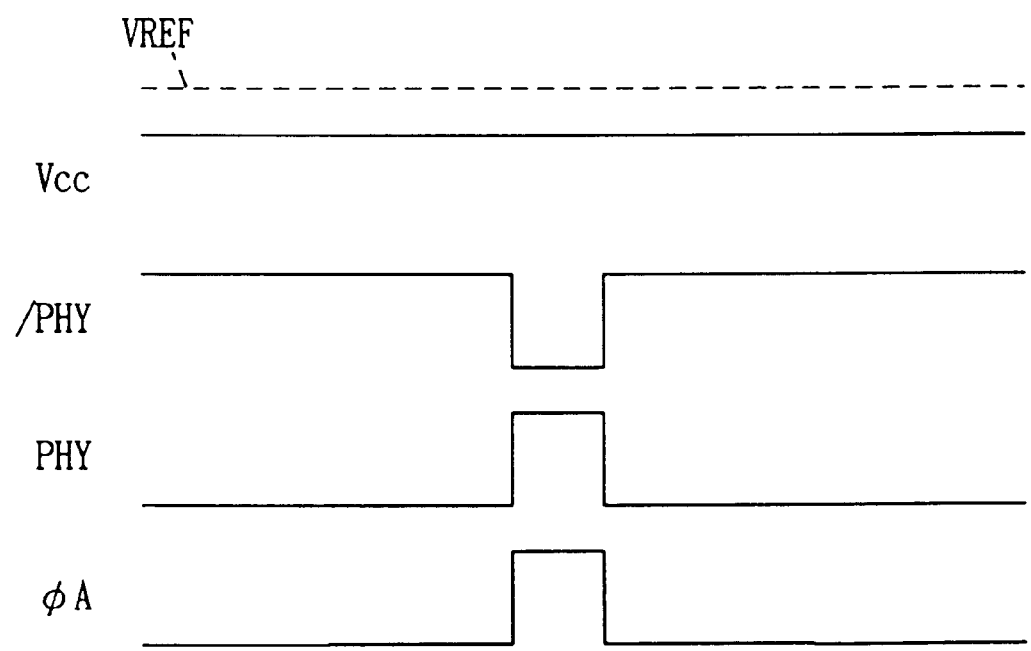

Description will now be given of the operation in the case where the power supply voltage Vcc is lower than the reference voltage VREF with reference to FIG. 7B.

The operation in the precharge state where signals PHY and /PHY are at an "L" level and an "H" level, respectively, is the same as that described above. When the signal PHY rises to an "H" level and the signal /PHY falls to an "L" level, power supply voltage detecting circuit 30 carries out the detecting operation. In this state, since the conductance of transistor 131 is larger than that of transistor 132, the potential of node 141 becomes higher than that of node 142. Therefore, node 141 is charged through transistor 135, while node 142 is discharged through transistor 138. The potential of node 141 increases, and the potential of node 142 decreases. During the potential change, the potentials of nodes 141 and 142 are latched by the latch circuit configured of transistors 135 to 138 and the potential of node 142 is discharged to an "L" level at a high speed. As a result, the output φA from inverter circuit 145 rises to an "H" level.

Then, when the control signal PHY falls to an "L" level, and the control signal /PHY rises to an "H" level, nodes 141 and 142 again recover to the precharge state, and the signal φA falls to an "L" level. A so-called "dynamic latch" configuration is used in the circuit shown in FIG. 6. Alternatively, the power supply voltage detecting circuit may be configured of a static type latch circuit. In the case of the static type latch circuit, transistors 139 and 140 are omitted and the other conduction terminals (sources) of transistors 137 and 138 are connected to the ground potential. In this configuration, the control signals PHY and /PHY are not applied. A comparator circuit serving as an inverter latch circuit is implemented. In the case of the static type latch circuit, the self-refresh mode instruct signal φA is generated according to the power supply voltage Vcc level.

Figure 8:
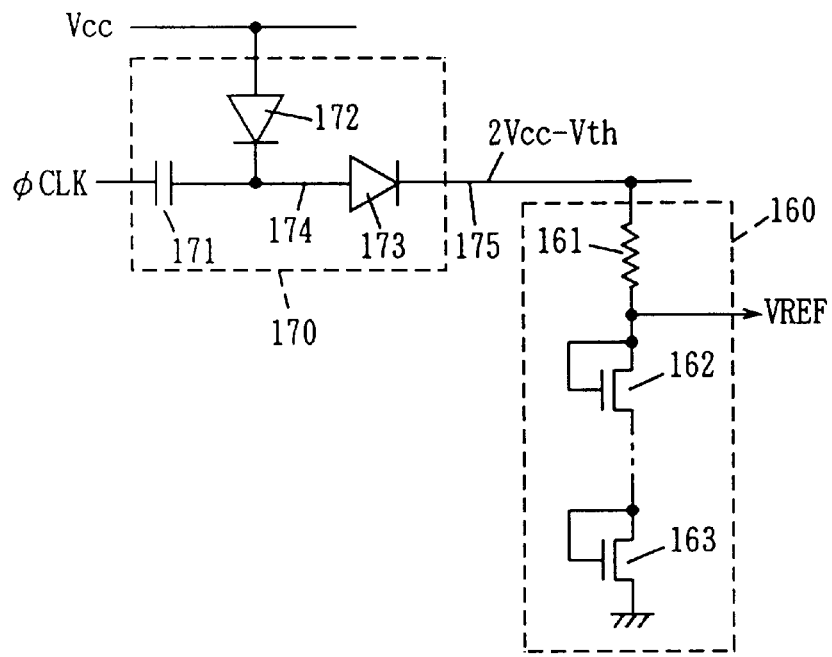
FIG. 8 is a diagram showing circuitry for generating a reference voltage used in the power supply voltage detecting circuit.

FIG. 8 is a diagram showing a configuration for generating a reference voltage (the reference voltage VREF of FIG. 6) independent of the power supply voltage Vcc. In FIG. 8, a circuit for generating the reference voltage includes a boosting circuit 170 boosting the power supply voltage Vcc up to the voltage level 2.Vcc−Vth, and a reference voltage generating circuit 160 generating a predetermined reference voltage VREF from the output voltage of boosting circuit 170. Boosting circuit 170, which has configuration of a charge pump circuit, includes a charge pump capacitor 171 carrying out the charge pump operation in response to a clock signal φCLK, a diode 172 having its anode connected to the power supply voltage Vcc supply node and its cathode connected to a node 174, and a diode 173 having its anode connected to node 174 and its cathode connected to an output node 175. Each of diodes 172 and 173 may be configured using an MOS transistor. The clock signal φCLK is generated using a circuit such as an internal ring oscillator.

Reference voltage generating circuit 160 includes a resistor element 161 of a high resistance receiving a boost voltage generated by boosting circuit 170, and n channel MOS transistors 162 . . . 163 each diode-connected and in series between an output node and the ground potential. The number of transistors 162 to 163 is set to an appropriate number according to the voltage level of the used reference voltage VREF. The operation will now be described briefly.

Node 174 is charged to the power supply voltage Vcc level by diode 172. When the clock signal φCLK rises to an "H" level, the potential of node 174 increases up to the level of 2Vcc by capacitive coupling of capacitor 171. When the potential of node 174 is higher than the potential of node 175, diode 173 is rendered conductive, and electric charges are injected from node 174 to node 175. As a result, the potential of node 174 decreases, and the potential of node 175 increases. Then, when the clock signal φCLK falls to an "L" level, the potential of node 174 is decreased by capacitive coupling of capacitor 171. However, the potential of node 174 is again charged by diode 172 to the power supply voltage Vcc level. When the clock signal φCLK rises to an "H" level, the potential of node 174 increases to the level of 2Vcc. Electric charges are again injected from node 174 to node 175, to increase the potential of node 175. By repeating the operation, the potential of node 175 is finally boosted up to the level of 2.Vcc−Vth. Reference voltage generating circuit 160 generates the reference voltage VREF from the boost signal which appears on output node 175 of boosting circuit 170.

If the threshold voltage vth is 1V, and the power supply voltage Vcc is 5V, the voltage level of output node 175 is 9V. In the case where 4V is used as the reference voltage VREF, transistors 162 to 163 are in a conductive state until the power supply voltage Vcc decreases to 2.5V, and can generate the reference voltage VREF stably. As a result, it is possible to generate the reference voltage VREF stably even at the time when the potential of the power supply voltage Vcc decreases.

In the configuration shown in FIG. 8, since a resistor element of a high resistance is used in reference voltage generating circuit 160, little current is consumed in the circuit. Therefore, only a small current supplying ability is required for boosting circuit 170 and a total current consumption of the device is not increased. The current supplying ability of the boosting circuit is determined by the product of frequency and the signal amplitude of the clock signal φCLK and capacitance of capacitor 171. It is possible to implement a boosting circuit with a small occupied area and small power consumption by using as capacitor 171 such as MOS capacitor which in turn implements a large capacitance value with a small occupied area even with a small-scale ring oscillator.

In the configuration of the comparing circuit shown in FIG. 6, the control signals PHY and /PHY are used. An arbitrary signal can be used as the control signal PHY. The internal clock signal φCLK shown in FIG. 8 may also be used. When the row address strobe signal RAS is used as the control signal PHY, the configuration is easily implemented in which the memory access operation is inhibited and then self-refresh is carried out in the case where the power supply voltage is lowered in the normal operation.

Figure 9:
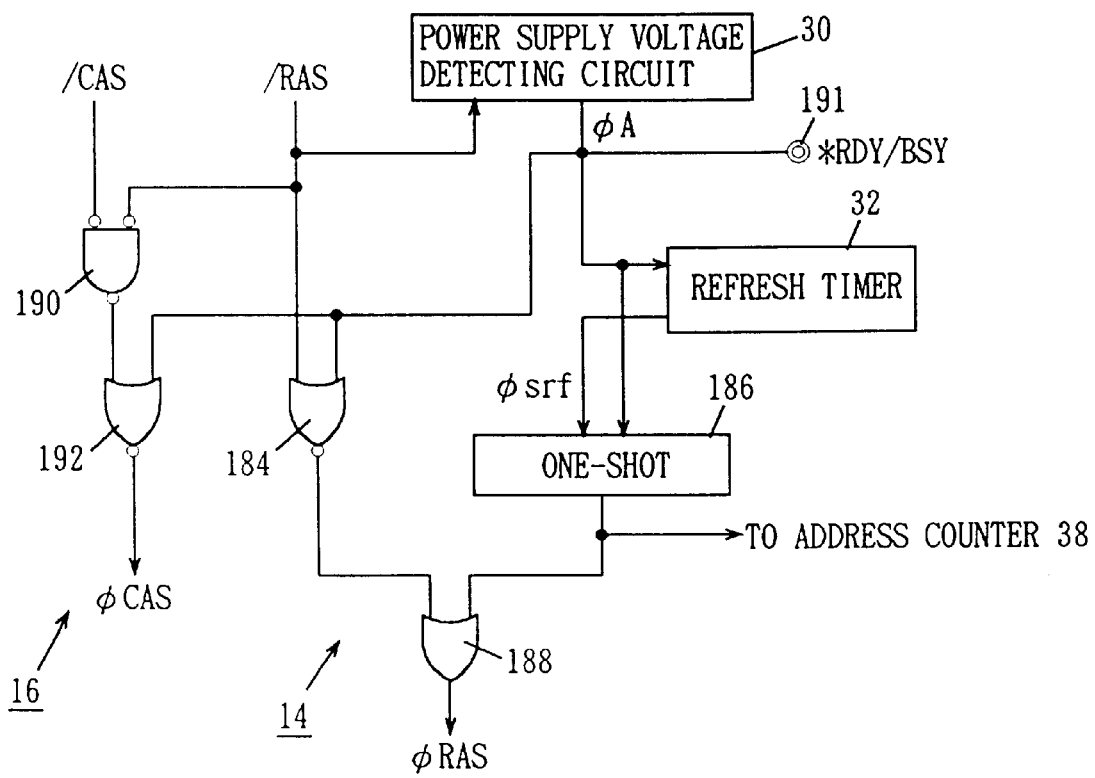
FIG. 9 is a diagram showing a configuration of a main portion in the dynamic type semiconductor memory device according to the present invention.

FIG. 9 is a diagram showing a configuration of internal control signal generating circuitry. In FIG. 9, RAS control signal generating circuit 14 includes a NOR circuit 184 receiving the row address strobe signal /RAS and the refresh instruct signal φA from power supply voltage detecting circuit 30, and an OR circuit 188 receiving the output of NOR circuit 184 and a one-shot pulse signal from a one-shot pulse generating circuit 186. One-shot pulse generating circuit 186 is included in refresh control circuit 34 shown in FIG. 1. One-shot pulse generating circuit 186 generates a pulse signal having a predetermined width in response to rising of the signal φA or the self-refresh instruct signal φsrf from refresh timer 32. The pulse signal from one-shot pulse generating circuit 186 has a time width ensuring row selection through completion of the sensing. The output of one-shot pulse generating circuit 186 is also applied to address counter 38 shown in FIG. 1. In response to falling of the one-shot pulse, the count value of address counter 38 is increased or decreased by one.

CAS control circuit 16 includes a gate (OR) circuit 190 receiving the column address strobe signal /CAS and the row address strobe signal /RAS, and a NOR circuit 192 receiving the output of gate circuit 190 and the self-refresh mode instruct signal φA from power supply voltage detecting circuit 30. Gate circuit 190 operates as a buffer when the signal /RAS attains an "L" level. Gate circuit 190 provides a signal of an "H" level when the signal /RAS attains an "H" level. More specifically, gate circuit 190 provides a signal of an "L" level only when the signals /RAS and /CAS both attain an "L" level.

Figure 10:
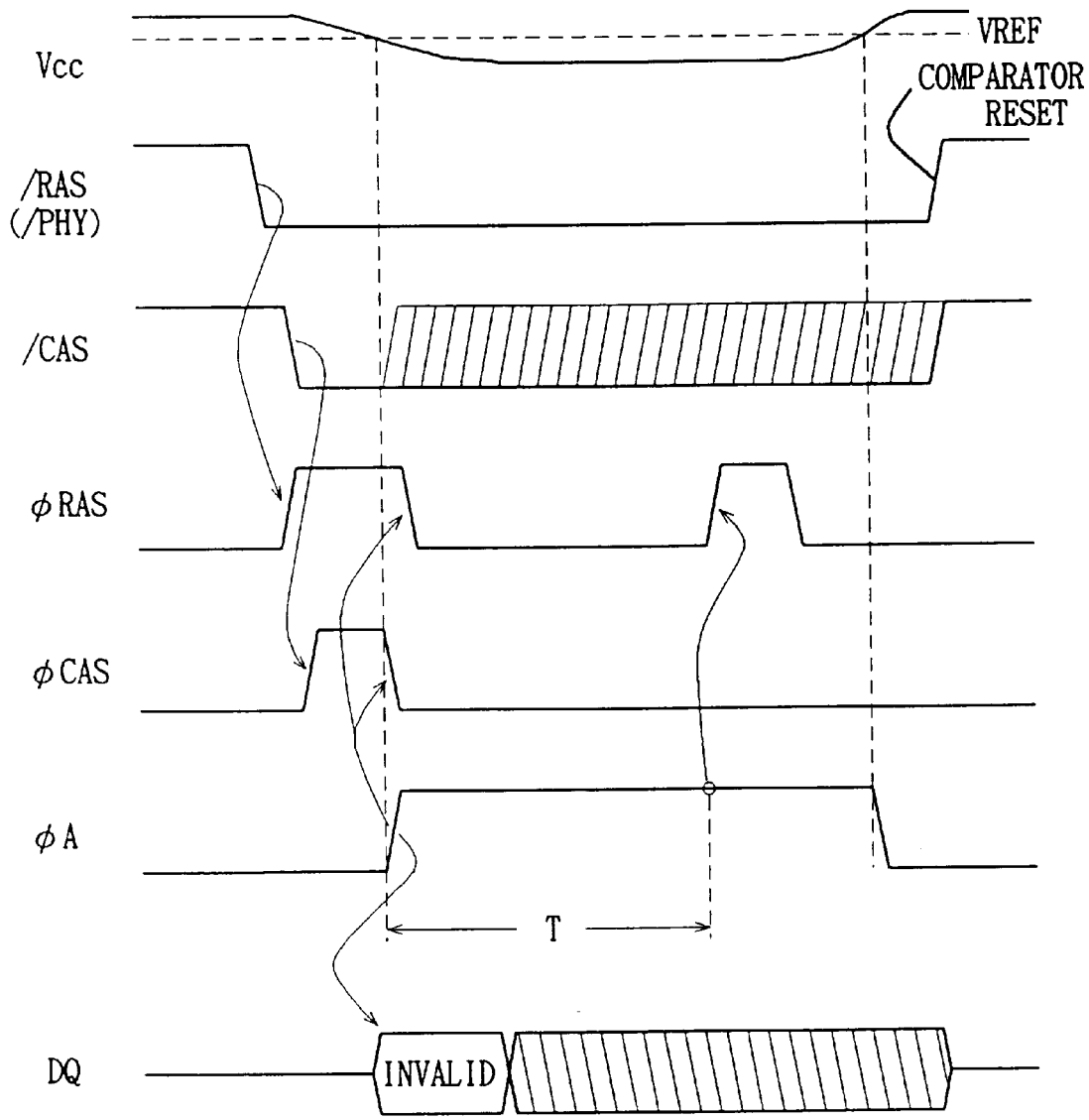
FIG. 10 is a signal waveform diagram showing the operation of the circuit shown in FIG. 9.

Power supply voltage detecting circuit 30 is brought into an operative state in response to the row address strobe signal /RAS. The self-refresh mode instruct signal φA from power supply voltage detecting circuit 30 is provided as a signal *RDY /BSY through an external pin terminal 191. When the signal *RDY /BSY of external pin terminal 191 is at an "L" level, a state is indicted where the semiconductor memory device can be accessed. When the signal *RDY /BSY attains an "H" level, the power supply voltage Vcc is a predetermined potential level or less, self-refreshing is carried out within the semiconductor memory device, an access inhibit state is indicated. By provision of external pin terminal 191, an external processing device can know whether or not the semiconductor memory device is in the self-refresh mode. As a result, even if the semiconductor memory device automatically enters the self-refresh mode internally, the external processing device can easily know the state of the semiconductor memory device. The operation of the circuit shown in FIG. 9 will now be described with reference to FIG. 10, which is the operating waveform diagram.

In the normal access, the signal /RAS falls to an "L" level, and then the signal /CAS falls to an "L" level. When the power supply voltage Vcc is a normal value, that is, the reference voltage level VREF or more, the signal φA is at an "L" level. Therefore, the output of gate circuit 184 attains an "H" level, the internal control signal φRAS from OR circuit 188 rises in response to falling of the signal /RAS, and the row selecting operation is carried out.

On the other hand, gate circuit 190 provides a signal of an "L" level when the signals /RAS and /CAS attain an "L" level. NOR circuit 192 generates the signal φCAS which rises in response to falling of the signal /CAS, since the signal φA is at an "L" level. As a result, the column selecting operation is carried out.

In the normal cycle operation, consider the state where the power supply voltage Vcc falls to an "L" level. At this time, the signal φA rises to an "H" level, and the output signal φCAS of NOR circuit 192 falls to an "L" level. One-shot pulse generating circuit 186 generates a one-shot pulse signal, and the output of NOR circuit 184 falls to an "L" level. However, since OR circuit 188 receives the one-shot pulse from one-shot pulse generating circuit 186, the output signal φRAS maintains an "H" level state for a predetermined period of time after rising of the signal φA. As a result, in the row selecting operation, a word line is brought into a non-selected state after the sensing operation is carried out, thereby preventing destruction of data of memory cells. More specifically, sensing, amplification and restoring by sense amplifiers of data of memory cells of a row selected according to an external address can be reliably carried out. Even if the selected state of multiplex circuit 39 (cf.FIG. 1) switches, row address buffer 22 shown in FIG. 1 maintains the latch state of the external address at that time (the row address buffer is not brought into a latch release state because of the signal φRAS at "H").

Refresh timer 32 is activated in response to the signal φA to carry out the clocking operation. After a predetermined period of time, refresh timer 32 generates the self-refresh request signal φsrf. At this time, since the signal *RDY /BSY from external terminal 191 attains an "H" level, the external device determines that the data DQ read out at that time is in an invalid state and enters a waiting state. This is because it cannot be determined whether or not input/output of data is accurately carried out since the signal φCAS falls in response to the signal φA.

In the meantime, it is possible to set the signal /CAS to an arbitrary state. This is because the output of NOR circuit 192 is fixed to an "L" level. When the signal φA falls to an "L" level, the signal *RDY /BSY of external pin terminal 191 falls to an "L" level, indicating the completion of the self-refresh mode. By the external device causing the signal /RAS to rise to an "H" level in response to the state change of the signal *RDY /BSY, power supply voltage detecting circuit 30 completes the detecting operation. Since the self-refresh operation may be carried out within the semiconductor memory device, the signal /RAS cannot fall to an "L" level before a lapse of a predetermined period of time. As a result, it is possible to reliably inhibit the external device from accessing the semiconductor memory device when the power supply voltage is lowered. It is also possible to reliably carry out self-refreshing also in the semiconductor memory device.

In the configuration shown in FIG. 9, power supply voltage detecting circuit 30 is driven using the signal /RAS. The detecting operation of the power supply voltage is carried out only at the time of normal access cycle. At the time of stand-by, power supply voltage detecting circuit 30 may be configured so as to operate when a chip select signal /CS attains an "H" level. A configuration may be used in which the detecting operation of the power supply voltage is carried out by using both the signals /CS and /RAS.

The configuration may be used in which the multiplex circuit switches connection according to the refresh request signal. This is for preventing collision of the refresh address and the external address.

As shown in FIG. 9, the state of the semiconductor device can be externally monitored by using external pin terminal 191. As a result, the external device can easily know the state of the semiconductor memory device even if the memory device enters the self-refresh mode without carrying out condition setting such as a CBR condition. The intervals at which the timer 32 generates the self-refresh request signal φsrf are made shorter than a specification value.

Figure 11A:
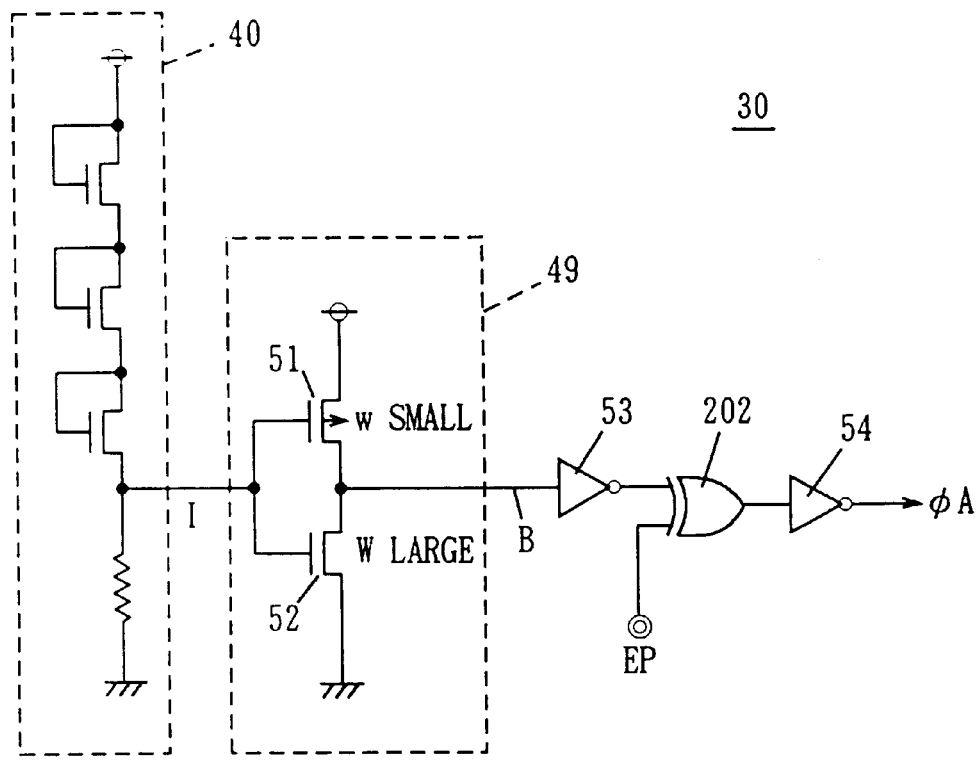
FIGS. 11A and 11B are diagrams showing, respectively, a configuration and the operation of a fifth embodiment of the power supply voltage detecting circuit shown in FIG. 1.
Figure 11B:
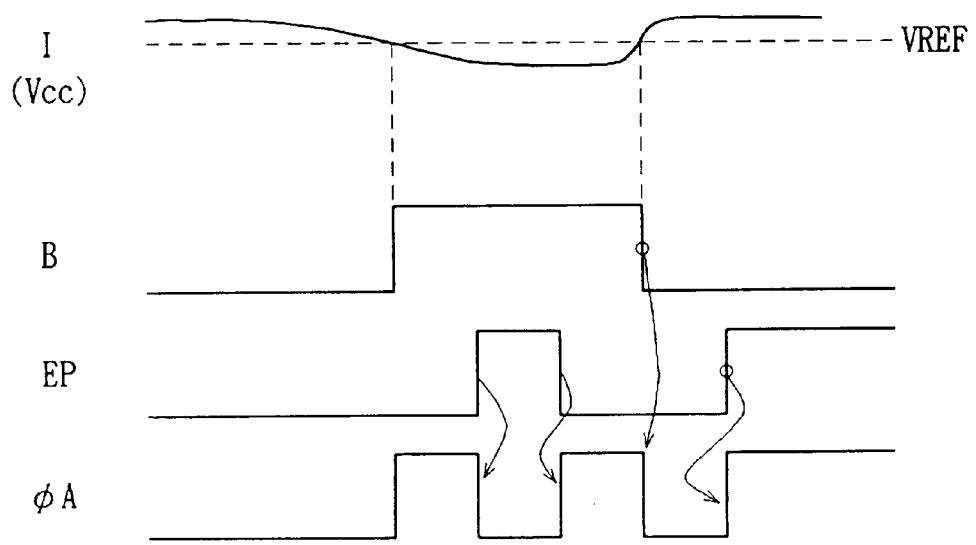

FIGS. 11A and 11B are diagrams showing the configuration and the operation of the sixth embodiment of the power supply voltage detecting circuit. In FIG. 11, power supply voltage detecting circuit 30 includes a level detecting circuit 40, a determination circuit 49 determining a level of a voltage provided from level detecting circuit 40, an inverter circuit 53 inverting and amplifying a signal potential of an output node B of determination circuit 49, and an inverter circuit 54 for inverting and amplifying the output of inverter circuit 53. Configurations of level detecting circuit 40, determination circuit 49, inverter circuits 53 and 54 are the same as those shown in FIG. 3A. Determination circuit 49 includes a p channel MOS transistor 51 with its gate width made relatively small, and an n channel MOS transistor 52 with its gate width made relatively large. Level detecting circuit 40 is configured of diode-connected transistors and a resistor element of a high resistance, and generates a voltage signal of, for example, Vcc−3.Vth.

Power supply voltage detecting circuit 30 further includes an EXOR circuit 202 receiving the output of inverter circuit 53 at its one input and a signal applied to an external pin terminal EP at its the other input. The output of EXOR circuit 202 is applied to the input of inverter circuit 54. EXOR circuit 202 serves as an inverter when a signal of an "H" level is applied to the external pin terminal EP, and serves as a buffer when a signal of "L" of a ground potential level is applied to the external pin terminal EP. Therefore, by applying a signal of an "H" level to the external pin terminal EP, it is possible to invert logic of the refresh mode instruct signal φA.

As shown in FIG. 11B, when the power supply voltage Vcc is lower than the reference voltage VREF, the potential of node B (the input of inverter circuit 53) is at an "H" level, and the self-refresh mode instruct signal φA is at an "H" level if the signal at the terminal EP is at "L". If the signal at terminal EP is made high ("H") the signal φA falls to an "L" level.

While the power supply voltage Vcc is in a normal state, the potential of node B attains an "L" level. If the potential of the external pin terminal EP is set to an "H" level at this time, the signal φA of an "L" level rises to an "H" level, and the self-refresh mode is designated.

It should be noted that EXOR circuit 202 may be provided so as to receive the output of inverter circuit 54.

As in the configuration shown in FIG. 11, by using the external pin terminal EP, the self-refresh mode can be entered or escaped easily irrespective of the level of power supply voltage Vcc. In this case, since instruction/release of self-refresh can be carried out by the potential level of one signal and no complicated signal timing requirement is necessitated, the self-refresh mode can be easily entered. Since the self-refresh mode is designated by using one signal, it is not necessary to drive numerous external circuits for setting CBR condition requiring a plurality of control signals, whereby a low power consumption is implemented. As the external pin terminal EP, an unused pin may be utilized.

Figure 12:
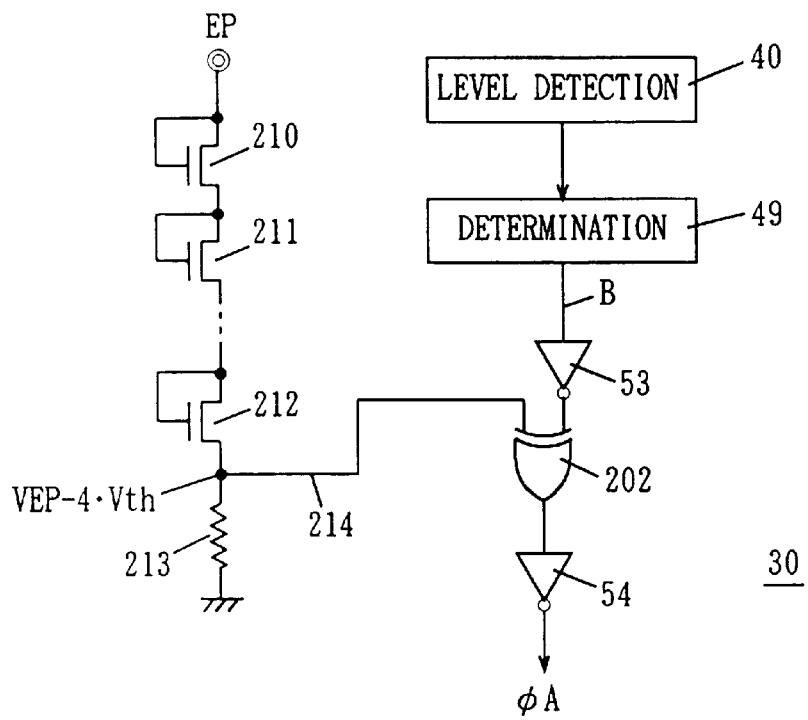
FIG. 12 is a diagram showing a configuration of a sixth embodiment of the power supply voltage detecting circuit.

FIG. 12 is a diagram showing the configuration of the seventh embodiment of the power supply voltage detecting circuit. Power supply voltage detecting circuit 30 shown in FIG. 12 includes n channel MOS transistors 210, 211, ..., 212 each diode-connected and connected in series between the external pin terminal EP and a node 214, and a resistor element 213 of a high resistance connected between node 214 and the ground potential. When four transistors 210 to 212 are connected in series, a voltage of VEP–4.Vth appears on node 214. VEP is a voltage level applied to the external pin terminal EP. The other configuration is the same as that shown in FIG. 11.

In the normal operation where the voltage level of the external pin terminal EP is 0 to 5V, the voltage level of node 214 is approximately 0 to 1V (in the case where transistors 210 to 211 are four and Vth is 1V). In this case, since EXOR circuit 202 serves as a buffer circuit, the state of the signal φA does not change.

When the voltage VEP applied to the external pin terminal EP is set to a so-called supper Vcc (a voltage level sufficiently higher than the normal power supply voltage Vcc, for example, 9V), the voltage level of node 214 attains approximately the power supply voltage Vcc level. In this case, EXOR circuit 202 serves as an inverter. Therefore, the operation similar to that illustrated by the operating waveform diagram shown in FIG. 11B is carried out.

In the case of the configuration shown in FIG. 12, by setting the potential of the external pin terminal EP to a so-called "super Vcc", the self-refresh mode can be easily entered or escaped. More specifically, the self-refresh operation which is internally carried out can be halted, and in addition new self-refresh operation can be carried out as well. In other words, according to the voltage level applied to the external pin terminal EP, the logic of the signal φA can be inverted. In the case of the configuration shown in FIG. 12, by setting the external pin terminal EP to the voltage level of "super Vcc", the logic of the signal φA is inverted. Therefore, the pin terminal used in the normal operation can be utilized. It is possible to designate instruction and release of the self-refresh mode without increasing the number of pin terminals. Since resistor element 213 of a high resistance is provided, little current flows in the circuit, causing little increase of a current consumption.

It may be structured such that the "CBR refresh" cycle is carried out when the external control signals is used, and that only the "CBR self-refresh" is carried out when the power supply voltage is lowered.

Figure 13:
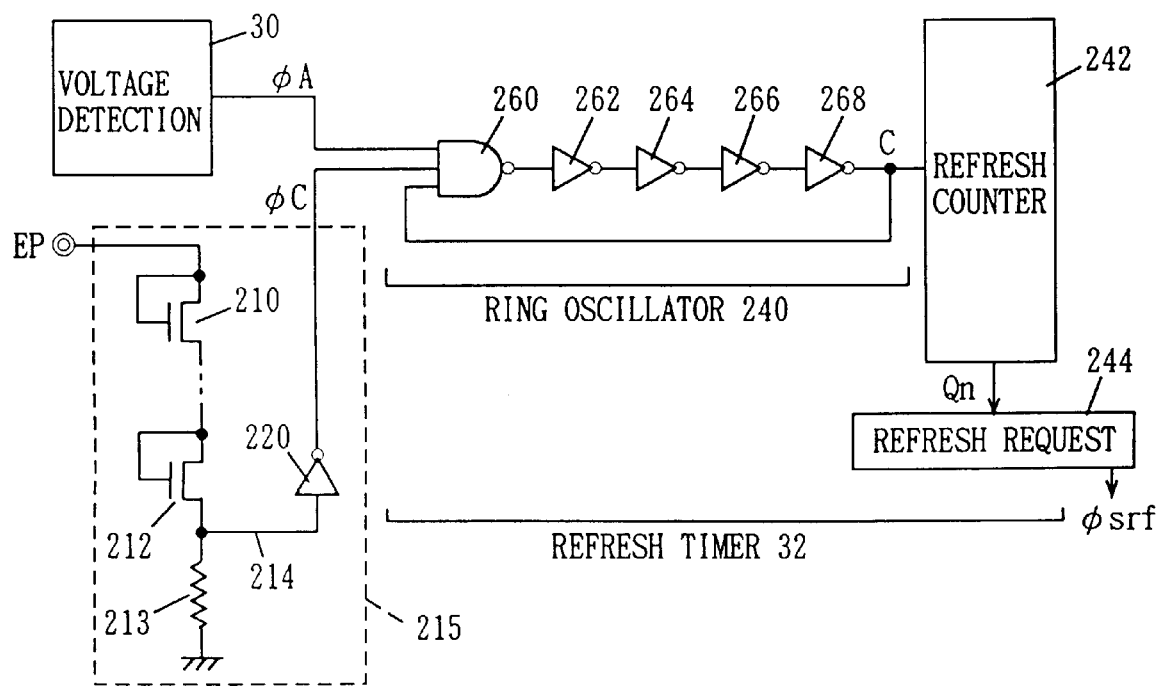
FIG. 13 is a diagram showing a configuration of self-refresh mode instruct signal generating circuitry according to the present invention.

FIG. 13 is a diagram showing other configuration of the self-refresh mode instruct signal generating circuitry. In FIG. 13, the self-refresh mode instruct signal generating circuitry includes power supply voltage detecting circuit 30, a refresh release designating circuit 215 releasing the self-refresh mode in response to a voltage signal applied to the external pin terminal EP, and refresh timer 32 clocking a refresh interval in response to the refresh mode instruct signal φA from power supply voltage detecting circuit 30 and an output φC of refresh release designating circuit 215.

Refresh timer 32 includes a ring oscillator 240 carrying out an oscillating operation in response to the signal φA and the output signal φC of refresh release designating circuit 215, a counter 242 counting the number of output clocks of ring oscillator 240, and a refresh circuit 244 generating the refresh request signal φsrf every predetermined count value. Ring oscillator 240 includes a 3-input NAND circuit 260, and an even number of (four in FIG. 13) cascade-connected inverter circuits 262, 264, 266, and 268. NAND circuit 260 receives the signal φA, the output signal φC of refresh release designating circuit 215 and the output of inverter 268.

Figure 14:
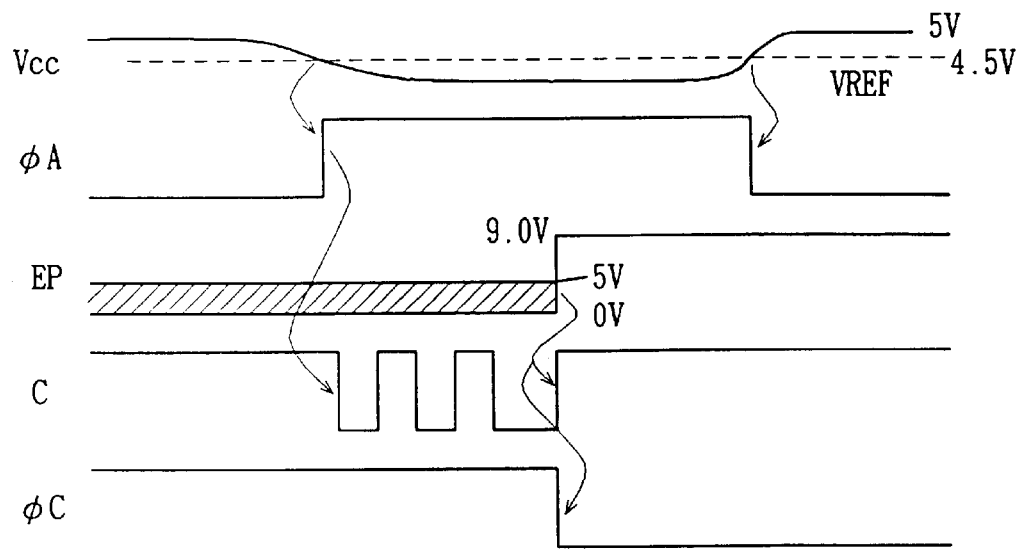
FIG. 14 is a signal waveform diagram showing the operation of the circuit shown in FIG. 13.

Refresh release designating circuit 215 includes n channel MOS transistors 210 to 212 each diode-connected and cascade-connected between the external pin terminal EP and node 214, resistor element 213 of a high resistance connected between node 214 and the ground potential, and an inverter circuit 220 inverting the potential of node 214. The operation of the circuit shown in FIG. 13 will now be described with reference to FIG. 14, which is the operating waveform diagram.

When the power supply voltage Vcc is at a normal level (when the power supply voltage is higher than the reference voltage VREF (for example, 4.5V)), the signal φA is at an "L" level. In this case, the output of NAND circuit 260 is fixed to an "H" level (the power supply voltage Vcc level). Therefore, ring oscillator 240 does not carry out any oscillating operation in this case. Even if the voltage of the external pin terminal EP changes in the range of 0 to 5V, the voltage level which appears on node 214 changes only in the range of 0 to 1V (in the case where transistors 210 to 212 include four MOS transistors), and the output signal φC of inverter circuit 220 is maintained at an "H" level.

When the power supply voltage Vcc is lower than the reference voltage VREF, the signal φA rises to an "H" level, and NAND circuit 260 operates as an inverter circuit. As a result, ring oscillator 240 is configured of an odd number of stages of tandem-connected inverter circuits. Ring oscillator 240 carries out the oscillating operation to generate a signal having a predetermined cycle and width from the output node C.

In this state, if the voltage level of the external pin terminal EP is set to a high voltage level of, for example, 9V, the potential level of node 214 rises to an "H" level, and the output signal φC of inverter circuit 220 falls to an "L" level. As a result, the output of NAND circuit 260 is fixed to an "H" level, ring oscillator 240 halts the oscillating operation, and the output node C is fixed to an "H" level, whereby the self-refresh mode can be released. In the configuration, the signal φC provided from inverter circuit 220 may also be applied to refresh counter 242 to reset refresh counter 242.

Figure 15:
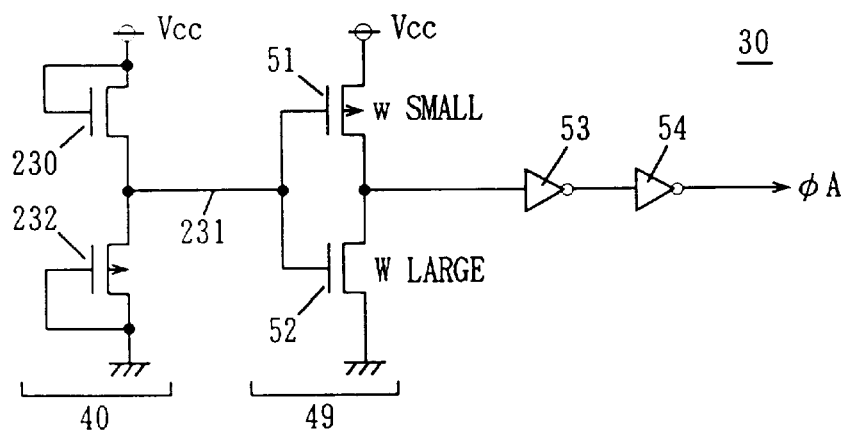
FIG. 15 is a diagram showing a configuration of an eighth embodiment of the power supply voltage detecting circuit shown in FIG. 1.

FIG. 15 is a diagram showing the configuration of the ninth embodiment of the power supply voltage detecting circuit. In FIG. 15, a level detecting circuit 40 includes an n channel MOS transistor 230 resistance-connected between the power supply voltage Vcc supply node and node 231, and a p channel MOS transistor 232 resistance-connected between node 231 and the ground potential supply node. Inverting circuit 49, inverter circuits 53 and 54 are the same as those shown in FIG. 3. By setting conductances (which are determined by W (gate width)/L (gate length)) of transistors 230 and 232 to appropriate values, a voltage of the power supply voltage Vcc divided according to resistance values of transistors 230 and 232 appears at node 231. In this case, according to change of the power supply voltage Vcc, the potential of node 231 changes linearly according to the conductance ratio of transistors 230 and 232. Although the input threshold of inverting circuit 49 slightly changes according to the power supply voltage Vcc, the degree of the change is substantially smaller than the potential level change of node 231. As a result, it is possible to rise the self-refresh mode instruct signal φA to an "H" level reliably when the power supply voltage Vcc is lowered.

[Configuration of Refresh Counter]

Figure 16:
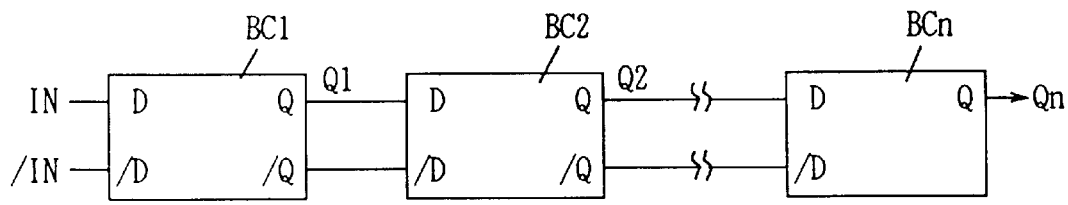
FIG. 16 is a diagram schematically showing a configuration of a refresh counter shown in FIG. 13.

FIG. 16 is a diagram showing a specific configuration example of refresh counter 242 included in the refresh timer. In FIG. 16, refresh counter 242 includes 1-bit binary counters BC1 to BCn of n stages. Binary counters BC1 to BCn are the same in configuration. Complementary output signals of ring oscillator 240 shown in FIG. 13 are applied to inputs D and /D of binary counter BC1 of a first stage. The complementary outputs of ring oscillator 240 are indicated by inputs IN and /IN.

Figure 17A:
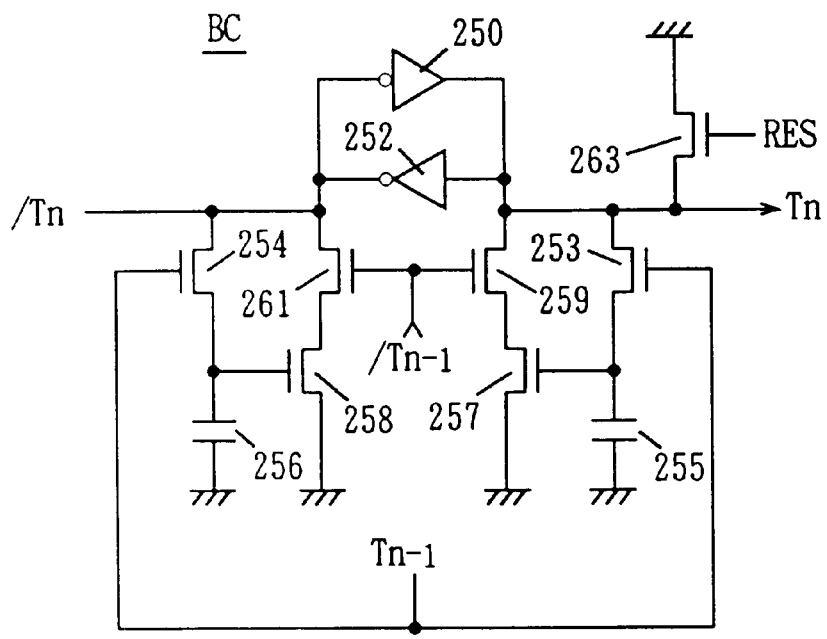
FIGS. 17A and 17B are diagrams showing a specific configuration and operation of a binary counter shown in FIG. 16, respectively.
Figure 17B:
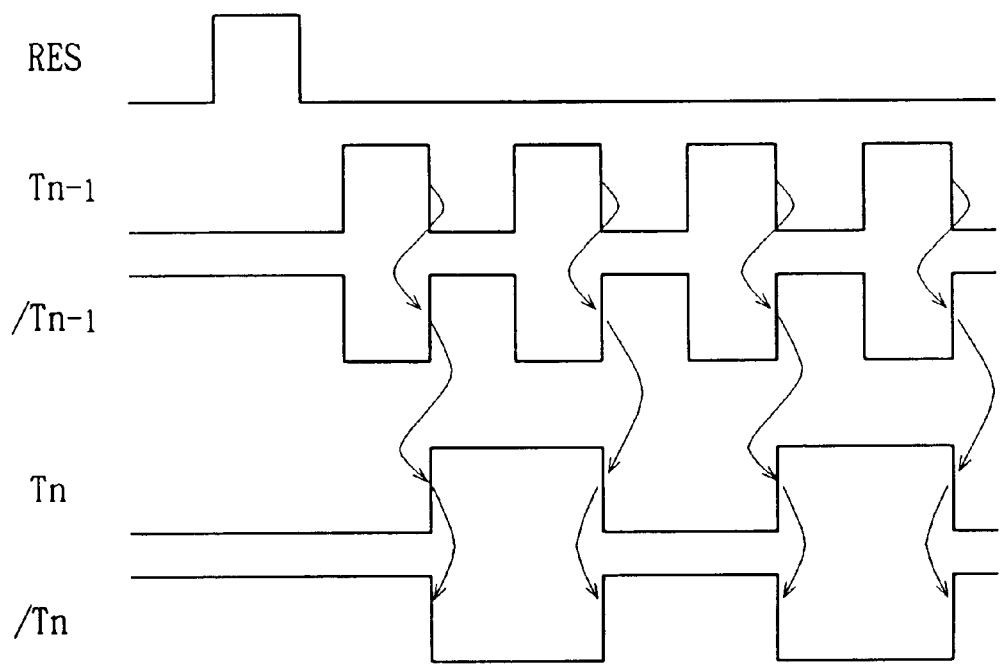

FIG. 17A is a diagram showing the configuration of the binary counter BC (which generally shows BC1 to BCn) shown in FIG. 16. In FIG. 17, the binary counter BC includes inverter circuits 250 and 252 for latching the signal potential of the output nodes Tn and /Tn, n channel MOS transistors 253 and 254 rendered conductive in response to the output Tn−1 of a binary counter of the preceding stage, capacitors 255 and 256 for storing potentials of the output nodes Tn and /Tn, respectively, through transistors 253 and 254, n channel MOS transistors 257 and 258 rendered conductive in response to the charge potentials of capacitors 255 and 256, and n channel MOS transistors 259 and 261 rendered conductive in response to the output /Tn−1 of a binary counter of the preceding stage and connecting one conduction terminals of transistors 257 and 258 to the output nodes Tn and /Tn, respectively.

One conduction terminal (source) each of transistors 257 and 258 is connected to the ground potential. The binary counter BC further includes an n channel MOS transistor 263 initializing the output node Tn to the ground potential in response to a reset signal RES. The operation of the binary counter BC shown in FIG. 17A will now be described with reference to FIG. 17B, which is the operating waveform diagram.

At the time of initialization, the reset signal RES is raised to an "H" level for a predetermined period of time. Responsively, transistor 263 is rendered conductive, and the output node Tn is set to an "L" level. The potential of an "L" level of the output node Tn is transmitted to the complementary output node /Tn through inverter circuit 252. As a result, at the time of initialization, the output node Tn attains an "L" level, and the complementary output node /Tn attains an "H" level.

After the resetting, the output Tn−1 of a binary counter of the preceding stage rises to an "H" level, and the complementary output signal /Tn−1 falls to an "L" level through counting operation. As a result, transistors 253 and 254 are rendered conductive, and charge potentials of capacitors 255 and 256 become corresponding to potential levels of the output nodes Tn and /Tn, respectively. More specifically, the charge potential of capacitor 255 attains an "L" level, and the charge potential of capacitor 256 attains an "H" level. As a result, transistor 257 is rendered non-conductive, and transistor 258 conductive.

When the output Tn−1 of a binary counter of the preceding stage falls to an "L" level, transistors 253 and 254 are rendered non-conductive, whereby the charging operation of capacitors 255 and 256 is completed. At this time, the output /Tn−1 of a binary counter of the preceding stage simultaneously rises to an "H" level, and transistors 259 and 261 are rendered conductive. Since transistor 257 is non-conductive and transistor 258 is conductive, the complementary output node /Tn is discharged to the ground potential level through transistors 261 and 268. On the other hand, since transistor 257 is non-conductive, the output node Tn is in a floating state. Therefore, according to decrease of the potential of the complementary output node /Tn, the last stage of a latch circuit configured of inverters 250 and 252 is reversed, discharge of the complementary output node /Tn is carried out at a high speed, and charge of the output node Tn is carried out at a high speed. As a result, the output node Tn and the complementary output node /Tn changed to an "H" level and an "L" level, respectively.

When the output Tn−1 of a binary counter of the preceding stage again rises to an "H" level, capacitors 255 and 256 are charged. In this cycle, capacitor 255 is charged to an "H" level, and capacitor 256 is discharged to the ground potential level. Then, when the signal Tn−1 falls to an "L" level, and the signal /Tn−1 rises to an "H" level, transistors 253 and 254 are rendered nonconductive, and transistors 259 and 261 are rendered conductive. According to the charge potentials of capacitors 255 and 256, the potential of the output node Tn falls to an "L" level, and the complementary output node /Tn rises to an "H" level.

More specifically, the binary counter circuit BC shown in FIG. 17A, inverts the output state every falling of the output Tn−1 of a binary counter circuit of the preceding stage.

Figure 18:
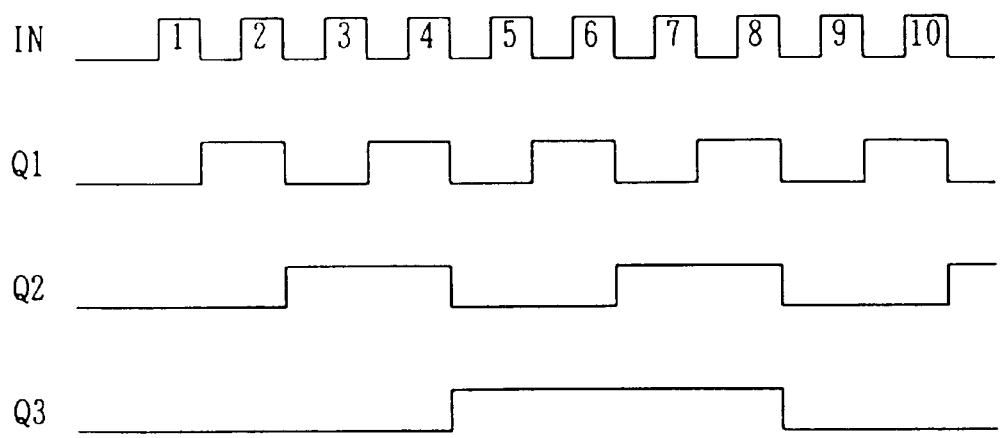
FIG. 18 is a signal waveform diagram showing operations of the refresh counter shown in FIG. 16.

FIG. 18 is a signal waveform diagram showing the operation in the case where the 1-bit binary counter circuits shown in FIG. 16 are connected in three stages. When the output signal IN of the ring oscillator is applied, the states of an output Q1 of binary counter BC1 of the first stage changes in response to falling of the output signal IN of the ring oscillator. More specifically, binary counter circuit BC1 frequency-divides the output IN of the ring oscillator by the factor of 2. Similarly, an output Q2 of binary counter circuit BC2 of the second stage changes its state in response to falling of the output Q1 of binary counter circuit BC1 of the first stage. Similarly, an output Q3 of the binary counter circuit BC3 of the third stage changes its state in response to falling of the output Q2 of binary counter circuit BC2 of the second stage. When output IN of the ring oscillator is counted eight times, outputs of binary counter circuits Q1 to Q3 are all reset to an "L" level in response to falling of the eighth signal IN. In response to falling of the output Qn of the last stage of the refresh counter, the refresh request signal φsrf is generated from refresh request signal generating circuit 254 shown in FIG. 13.

[Refresh Request Signal Generating Circuit]

Figure 19A:
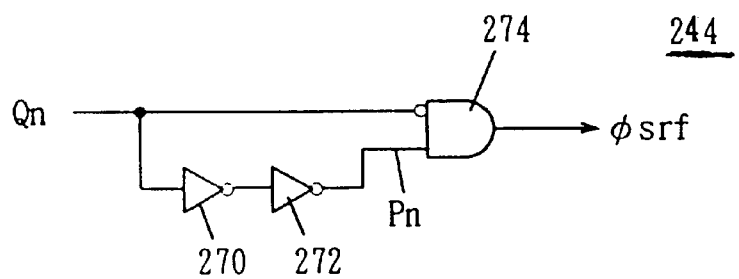
FIGS. 19A and 19B are diagrams showing a configuration and operation of the refresh request signal generating circuit shown in FIG. 13, respectively.
Figure 19B:
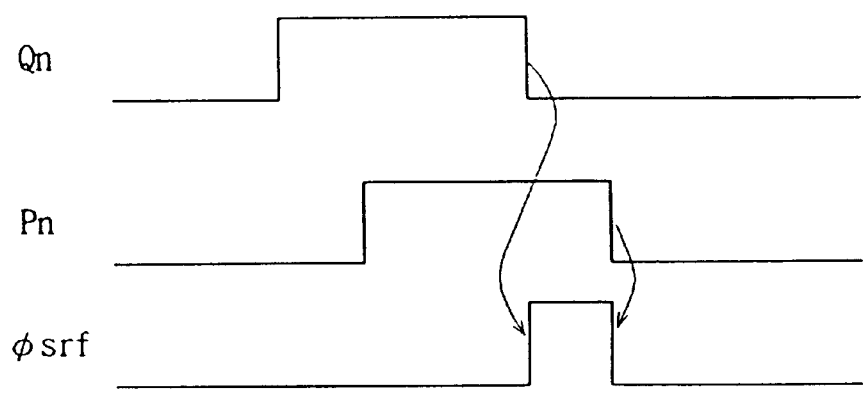

FIGS. 19A and 19B is a diagram showing the specific configuration and operation of the refresh request signal generating circuit shown in FIG. 13. In FIG. 19A, refresh request signal generating circuit 244 includes cascade-connected inverter circuits 270 and 272 for delaying the output Qn of refresh counter 242 by a predetermined period of time, and a gate circuit 274 receiving the signal Qn at its false input and the output of inverter circuit 272 at its true input. Gate circuit 274 provides a signal of an "H" level when the signal Qn is at an "L" level and the potential of the node Pn is at an "H" level. The refresh request signal $\phi$srf is generated from gate circuit 274. The operation will now be described with reference to FIG. 19B, which is the operating waveform diagram thereof.

While the signal Qn is at an "L" level, the output of inverter circuit 272 is also at an "L" level. When the signal Qn rises to an "H" level, the potential of the node Pn rises to an "H" level after a lapse of a predetermined time. In this state, the output of gate circuit 274 is still at an "L" level. When the signal Qn falls to an "L" level, the potential of the node Pn is still at an "H" level. Therefore, the output $\phi$srf of gate circuit 274 rises to an "H" level. As a result, the refresh request is generated. The width of the request signal $\phi$srf is determined by a delay time given by inverter circuits 270 and 272.

In place of the configuration shown in FIG. 19A, an AND circuit may be provided which receives all the outputs Q1 to Qn of the binary counter included in refresh counter 242, and the output of the AND circuit may be used as the refresh request signal $\phi$srf. In this case, a period during which the refresh request signal $\phi$srf is at an "H" level is one clock cycle of the clock signal IN generated by the ring oscillator (cf. FIG. 18).

Figure 20:
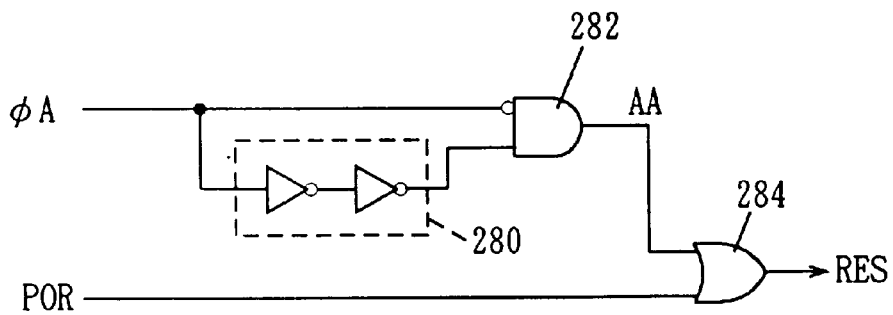
FIG. 20 is a diagram showing a specific configuration of a reset circuit shown in FIG. 1.

FIG. 20 is a diagram showing a circuit generating the reset signal RES of the binary counter circuit shown in FIG. 17. The shown reset circuit corresponds to reset circuit 36 shown in FIG. 1. In FIG. 20, reset circuit 36 includes a delay circuit 280 delaying the refresh instruct signal $\phi$A by a predetermined time, a gate circuit 282 receiving the output of delay circuit 280 and the signal $\phi$A, and an OR circuit 284 receiving the output of gate circuit 282 and a power-on reset signal POR. The reset signal RES is generated from OR circuit 284 to reset the refresh counter.

Figure 21A:
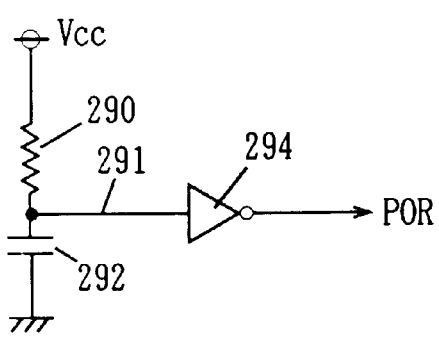
FIGS. 21A and 21B are diagrams showing a configuration and operation of a power-on reset signal generating circuit shown in FIG. 20, respectively.
Figure 21B:
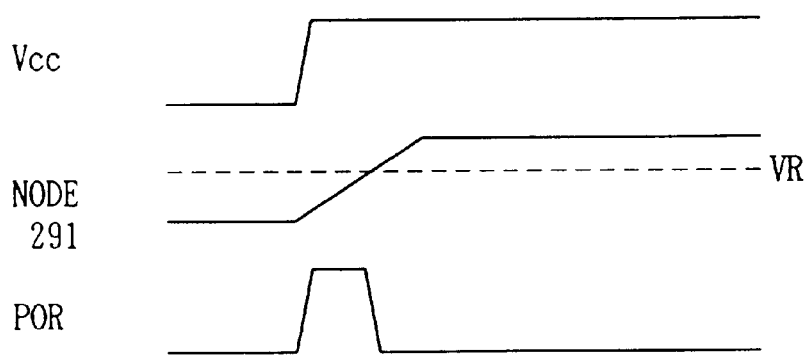

FIGS. 21A and 21B is a diagram showing a circuit configuration and the operation for generating the power-on reset signal POR. In FIG. 21A, the power-on reset signal generating circuit includes a resistance 290 connected between the power supply voltage supply node and a node 291, a capacitor 292 connected between node 291 and the ground potential node, and an inverter circuit 194 receiving the potential of node 291. Description will now be given of the operation of the power-on reset signal generating circuit shown in FIG. 21A with reference to FIG. 21A, which is the operating waveform diagram thereof.

Figure 22:
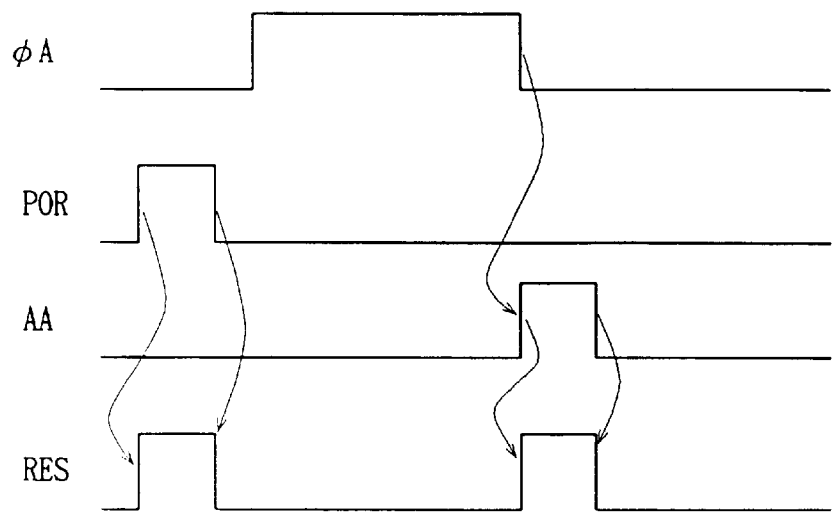
FIG. 22 is a signal waveform diagram showing the operation of the reset circuit shown in FIG. 20.

At the time of power-on of the power supply voltage Vcc, the power supply voltage Vcc rises to its predetermined level at a relatively high speed. On the other hand, node 291 gradually rises with a time constant RC by resistance 290 and capacitor 292. Therefore, in this state, until the potential of node 291 reaches a predetermined potential level VR after power-on, the outputs of inverter circuit 294 is at an "H" level. When the potential level reaches the predetermined voltage level VR, the output of inverter circuit 294 falls to an "L" level. In other words, the power-on reset signal POR is a signal which rises for a predetermined time at the time of power-on. The power-on reset signal is also used for resetting various circuits in the memory device at initialization at the time of power-on. The operation of the reset circuit shown in FIG. 20 will now be described with reference to FIG. 22, which is the operating waveform diagram thereof.

At the time of power-on, the power-on reset signal POR rises to an "H" level for a predetermined time. As a result, the reset signal RES from OR circuit 284 rises to an "H" level. Then, the power-on reset signal POR is fixed to an "L" level. When the power supply voltage Vcc is decreased to a predetermined voltage level or less, the refresh instruct signal $\phi$A rises to an "H" level. During this period, the ring oscillator operates, and the refresh request signal $\phi$srf is generated at a predetermined time interval.

Gate circuit 282 generates a signal which attains an "H" level while the signal $\phi$A applied to the one input is at an "L" level, and the output of delay circuit 280 attains an "H" level. More specifically, when the power supply voltage Vcc recovers to a predetermined potential level or more, the signal $\phi$A falls to "L" level, and the ring oscillator stops the oscillating operation, the potential level of the output node AA of gate circuit 282 rises to an "H" level for a predetermined time, and the reset signal RES rises to an "H" level, accordingly. In other words, when the self-refresh mode is stopped, the count value of the refresh counter is reset.

Figure 23:
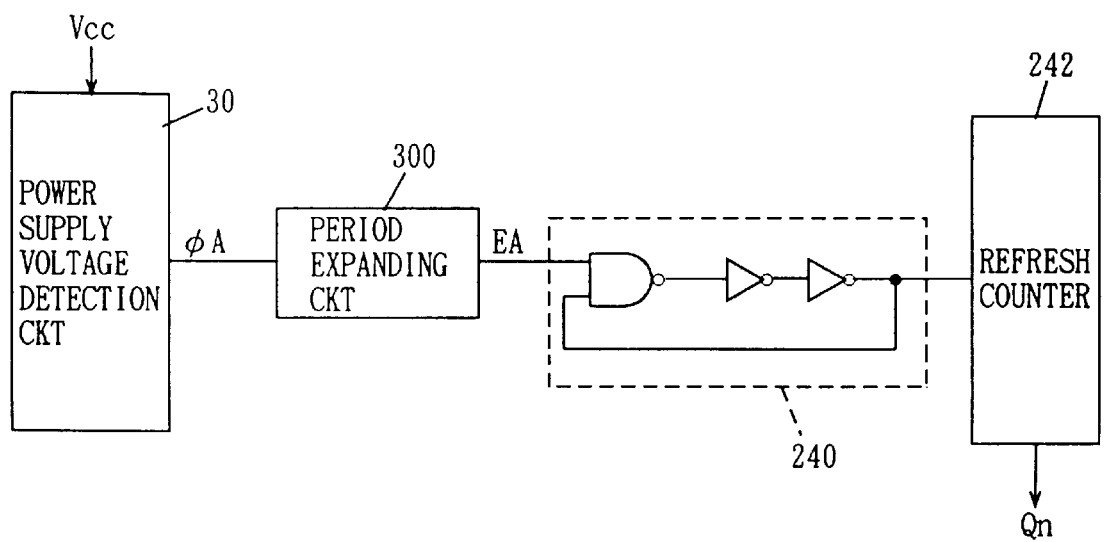
FIG. 23 is a diagram showing a configuration of a main portion of a dynamic type semiconductor memory device which is a further embodiment of the present invention.

FIG. 23 is a diagram showing the configuration of the ninth embodiment of the power supply voltage detecting portion. In the configuration shown in FIG. 23, a period expanding circuit 300 for delaying falling of the self-refresh instruct signal $\phi$A by a predetermined time is provided between power supply voltage detecting circuit 30 and ring oscillator 240. Ring oscillator 240 and refresh counter 242 are the same as those shown in FIG. 13 in configuration. Ring oscillator 240 carries out the oscillating operation while an output signal EA from period expanding circuit 300 is in an active state of an "H" level. More specifically, in the configuration shown in FIG. 23, even if the self-refresh mode instruct signal $\phi$A of power supply voltage detecting circuit 30 falls to an "L" level, the self-refresh mode is still maintained. In other words, self-refreshing is continuously carried out a predetermined times even after the power supply voltage Vcc recovers to the predetermined reference voltage VREF or more. As a result, it is possible to carry out external accessing after the power supply voltage Vcc is reliably brought into a stable state, whereby accurate writing and reading of data can be carried out.

Figure 24A:
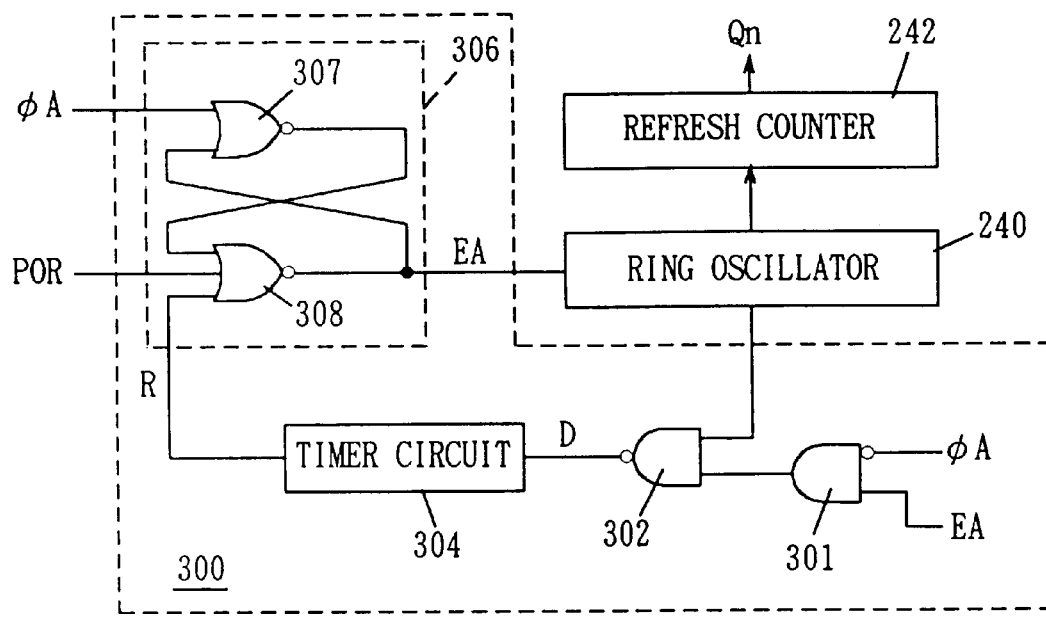
FIGS. 24A and 24B are diagrams showing a specific configuration example of operation of a period expanding circuit shown in FIG. 23, respectively.
Figure 24B:
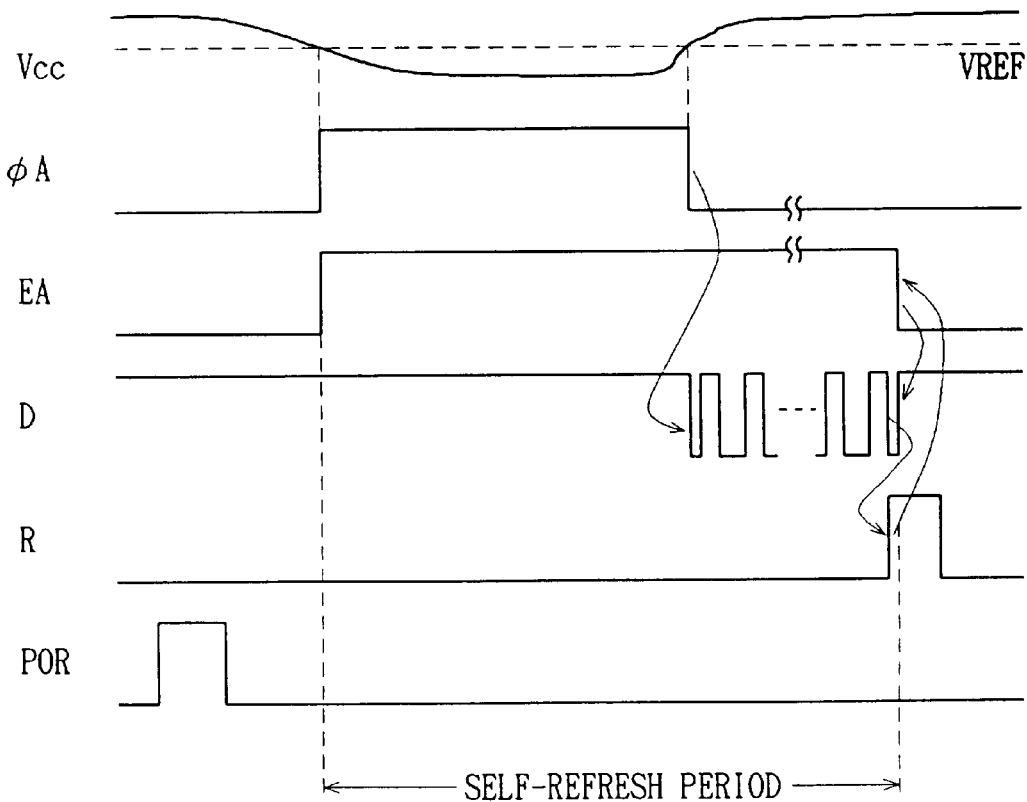

FIGS. 24A and 24B is a diagram showing a specific configuration example of the period expanding circuit shown in FIG. 23. In FIG. 24, period expanding circuit 300 includes a gate circuit 301 receiving the signals $\phi$A and EA, a NAND circuit 302 receiving the output of gate circuit 301 and the output of ring oscillator 240, a timer circuit 304 counting an output D of NAND circuit 302, and a set/reset flipflop 306 receiving an output R of timer circuit 304 and the power-on reset signal POR at its reset input, and receiving the signal $\phi$A at its set input. Gate circuit 301 provides a signal of an "H" level while the signal $\phi$A is at an "L" level, and the signal EA is at an "H" level. Timer circuit 304 counts clock signals generated by ring oscillator 240 applied through NAND gate 302 to generate a count up signal R when the count value reaches a predetermined value.

Set/reset flipflop 306 includes a NOR circuit 307 receiving the signals $\phi$A and EA, and a NOR circuit 308 receiving the output of NOR circuit 307, the power-on reset signal POR, and the output R of timer circuit 309. The signal EA is generated from NOR circuit 308. The operation of period expanding circuit 300 shown in FIG. 24A will now be described with reference to FIG. 24B, which is the operating waveform diagram thereof.

In the state where the power supply voltage Vcc is higher than the predetermined reference voltage VREF, the signal φA is at an "L" level. Set/reset flipflop 306 is brought into a reset state in response to the power-on reset signal POR generated at the time of power-on. More specifically, the signal EA is initialized to an "L" level. Therefore, in this state, ring oscillator 240 does not carry out the oscillating operation. The output of gate circuit 301 is at an "L" level, and the output D of NAND circuit 302 is fixed to an "H" level.

When the power supply voltage Vcc is lower than the reference voltage VREF, the signal φA rises to an "H" level. As a result, set/reset flipflop 306 is brought into a set state, and the signal EA rises to an "H" level. More specifically, the output of NOR circuit 307 attains an "L" level, and the output of NOR circuit 308 attains an "H" level. In response to this, ring oscillator 240 is activated, carries out the oscillating operation, and provides a clock signal having a predetermined cycle and a pulse width. Refresh counter 242 counts clock signals from ring oscillator 240 to generate the count up signal Qn whenever a predetermined count value is reached.

Since the signal φA is "H" level, gate circuit 301 provides a signal of an "L" level. Therefore, the output D of NAND circuit 302 is still fixed to an "H" level, and timer circuit 304 does not carry out the counting operation.

When the power supply voltage Vcc returns to a value of the predetermined reference voltage VREF or more, the signal φA falls to an "L" level. Since the signals R and POR are still at an "L" level, the output EA of set/reset flipflop 306 does not change, and maintains the state of an "H" level. On the other hand, gate circuit 301 provides a signal of an "H" level since the signal φA attains an "L" level and the signal EA is at an "H" level. As a result, NAND circuit 302 serves as an inverter, and inverts and passes a clock signal applied from ring oscillator 240.

Timer circuit 304 counts signals applied from NAND circuit 302 to generate the reset signal R when a predetermined count value is reached. When the reset signal R from timer circuit 304 rises to an "H" level, the output of NOR circuit 308, that is, the signal EA, falls to an "L" level, and ring oscillator 140 halts the oscillating operation. In parallel to this, the output of gate circuit 301 falls to an "L" level, the output of NAND circuit 302 is fixed to an "H" level, and the counting operation of timer circuit 304 is inhibited.

As described above, by carrying out self-refreshing a predetermined times even after the recovery of the power supply voltage Vcc to a level higher than the reference voltage VREF, it is possible to carry out accessing to the semiconductor memory device after the power supply voltage Vcc is in a stable state, whereby the accurate memory operation is ensured.

Figure 25:
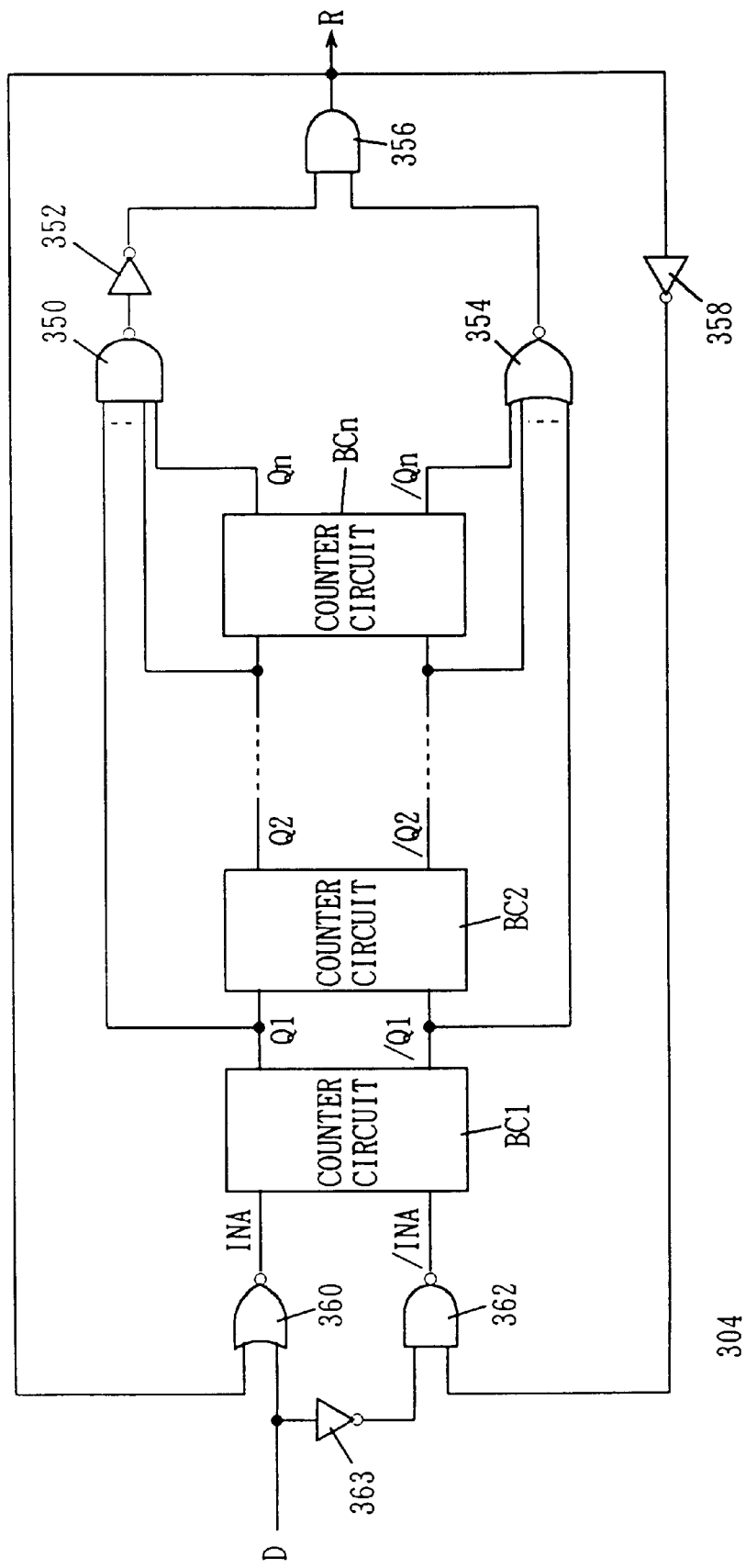
FIG. 25 is a diagram showing a specific configuration example of a timer circuit shown in FIG. 24.

FIG. 25 is a diagram showing a specific configuration of the timer circuit shown in FIG. 24A. In FIG. 25, timer circuit 304 includes 1-bit binary counter circuits BC1 to BCn having the same configuration as that shown in FIG. 17A, a NAND circuit 350 receiving the outputs Q1 to Qn of counter circuits BC1 to BCn, an inverter circuit 352 receiving the output of NAND circuit 350, a NOR circuit 354 receiving the complementary outputs /Q1 to /Qn of counter circuits BC1 to BCn, and an AND circuit 356 receiving the output of inverter circuit 352 and the output of NOR circuit 354. The reset signal R is generated from AND circuit 356.

Figure 26:
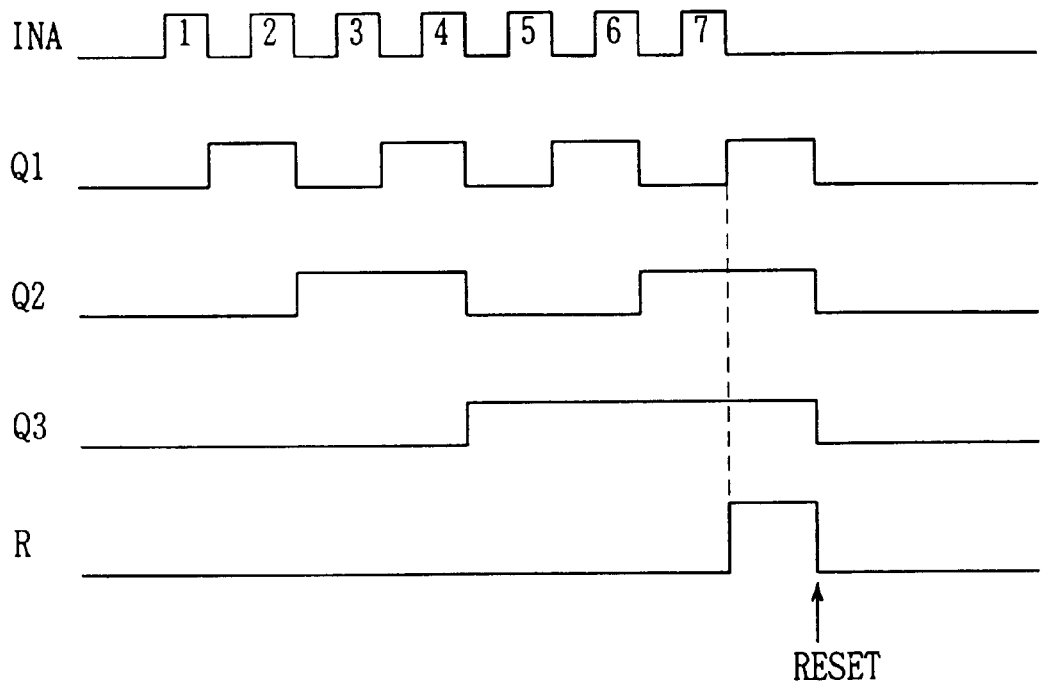
FIG. 26 is a signal waveform diagram showing the operation of the timer circuit shown in FIG. 25.

Timer circuit 304 further includes an inverter circuit 358 inverting the reset signal R, a NOR circuit 360 receiving the reset signal R and the output D of NAND circuit 302 shown in FIG. 24A, and a NAND circuit 362 receiving the signal D through inverter 363. The operation of timer circuit 304 shown in FIG. 25 will now be described with reference to FIG. 26, which is the operating waveform diagram thereof. In FIG. 26, the operation in the case where three counter circuits are provided is shown as an example.

When the reset signal R is at an "L" level, both NOR circuit 360 and NAND circuit 362 serve as inverter circuits. When the output D of NAND circuit 302 shown in FIG. 24 oscillates, the outputs of circuits 360 and 362 change, respectively. Outputs INA and /INA of circuits 360 and 362 are in-phase synchronized because NAND circuit 302 shown in FIG. 24 serves as an inverter in the oscillating operation, and circuits 360 and 362 also serves as inverters. Counter circuit BC (which generically shows BC1 to BCn) changes the output state in response to falling of the signal Q applied to its input. The counting operation of counter circuit BC is the same as the operation described previously with reference to FIG. 17. When the count value of counter circuit 304 reaches a predetermined value, the outputs Q1 to Qn (Q1 to Q3 in FIG. 26) of counter circuits BC1 to BCn all attain an "H" level, and the complementary outputs /Q1 to /Qn all attain an "L" level. As a result, the output of inverter circuit 352 rises to an "H" level, the output of NOR circuit 354 also rises to an "H" level, and the reset signal R from NAND circuit 360 rises to an "H" level.

When the reset signal R rises to an "H" level, the output of NOR circuit 360 is fixed to an "L" level, and the output of NAND circuit 362 is fixed to an "L" level. As a result, the counting operation of counter circuit BC is inhibited. Counter circuits BC1 to BCn are reset by a reset circuit to be described later after a lapse of a predetermined time, and the reset signal R also falls to an "L" level.

Figure 27:
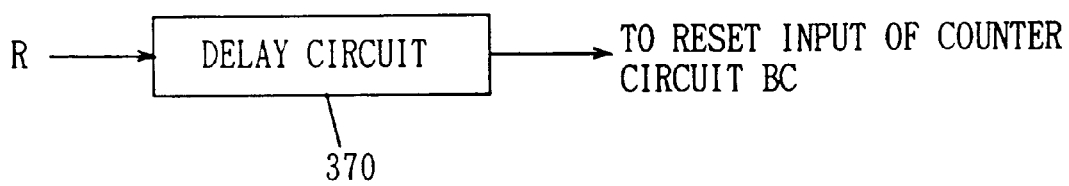
FIG. 27 is a diagram showing a circuit configuration for generating a reset signal of the timer circuit shown in FIG. 25.

FIG. 27 is a diagram showing a configuration for resetting the timer circuit. In FIG. 27, the reset circuit includes a delay circuit 370 delaying the reset signal R by a predetermined time. The output of delay circuit 370 is applied to a reset input (cf. transistor 263 of FIG. 17) of counter circuit BC (BC1 to BCn) shown in FIG. 25. As a result, counter circuit BC (BC1 to BCn) is reset after a lapse of a predetermined time, and the reset signal R also falls to an "L" level, accordingly.

Figure 28:
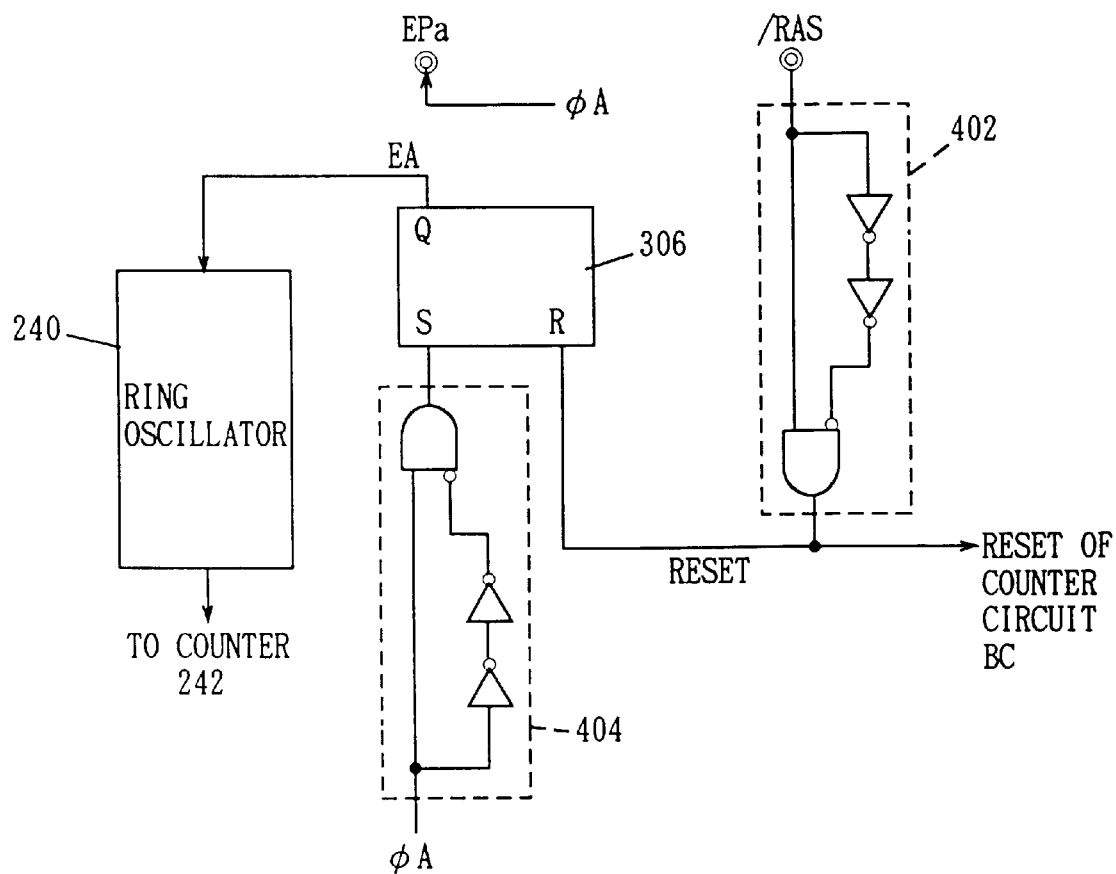
FIG. 28 is a diagram showing another configuration example for generating the reset signal of the counter circuit shown in FIG. 25.

FIG. 28 is a diagram showing the configuration of the second embodiment for resetting the refresh timer. In FIG. 28, the reset circuit includes a one-shot pulse generating circuit 402 generating a one-shot pulse signal in response to rising of the row address strobe signal /RAS, a one-shot pulse generating circuit 404 generating a one-shot pulse in response to rising of the signal φA from power supply voltage detecting circuit 30, and set/reset flipflop 306 receiving the output of one-shot pulse generating circuit 404 at a set input S, and receiving the output of one-shot pulse generating circuit 402 at a reset input R.

Figure 29:
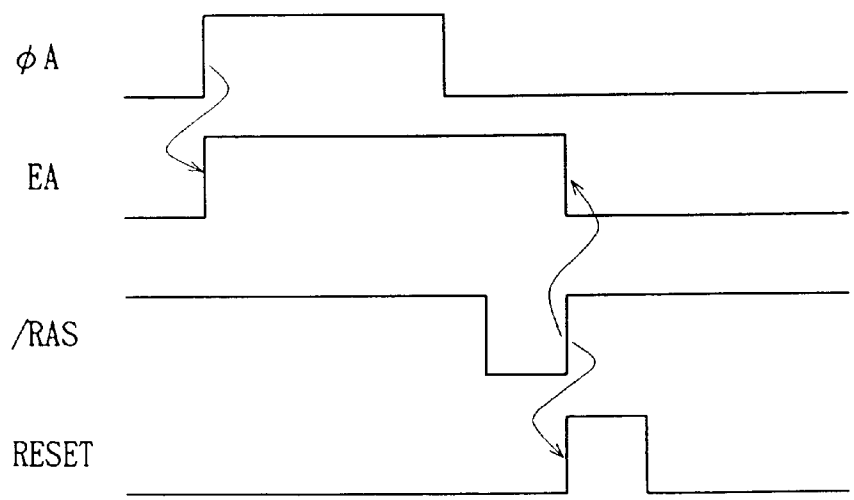
FIG. 29 is a signal waveform diagram showing the operation of a reset circuit shown in FIG. 28.
Figure 30:
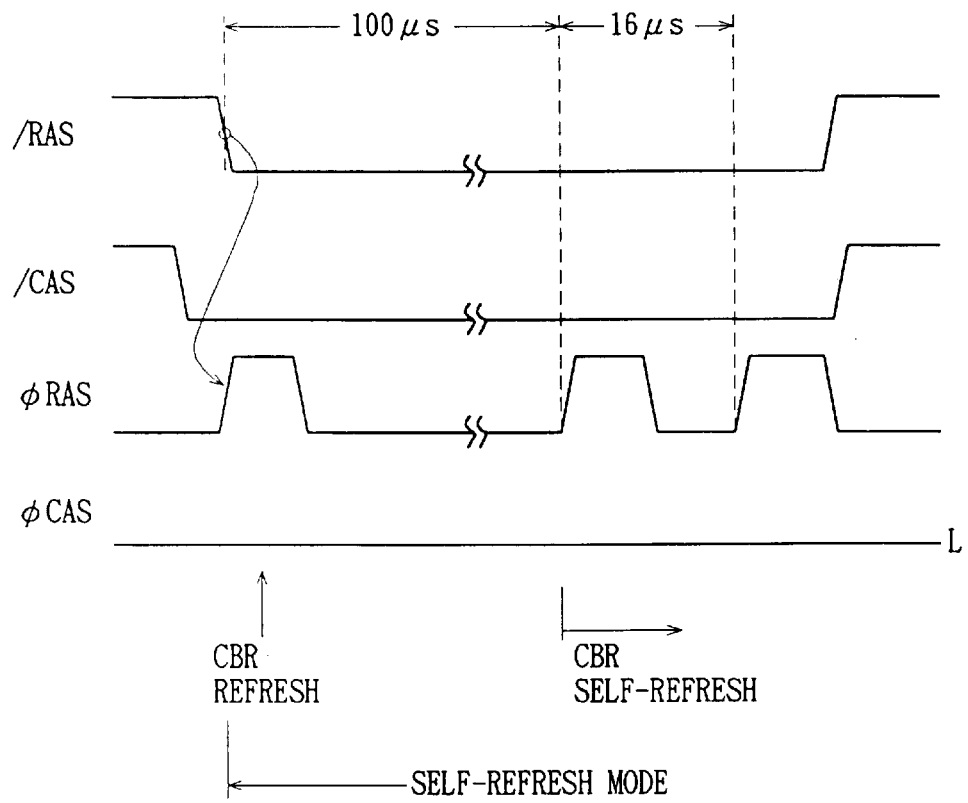
FIG. 30 is a signal waveform diagram showing the operation in a conventional self-refresh mode operation.
Figure 31:
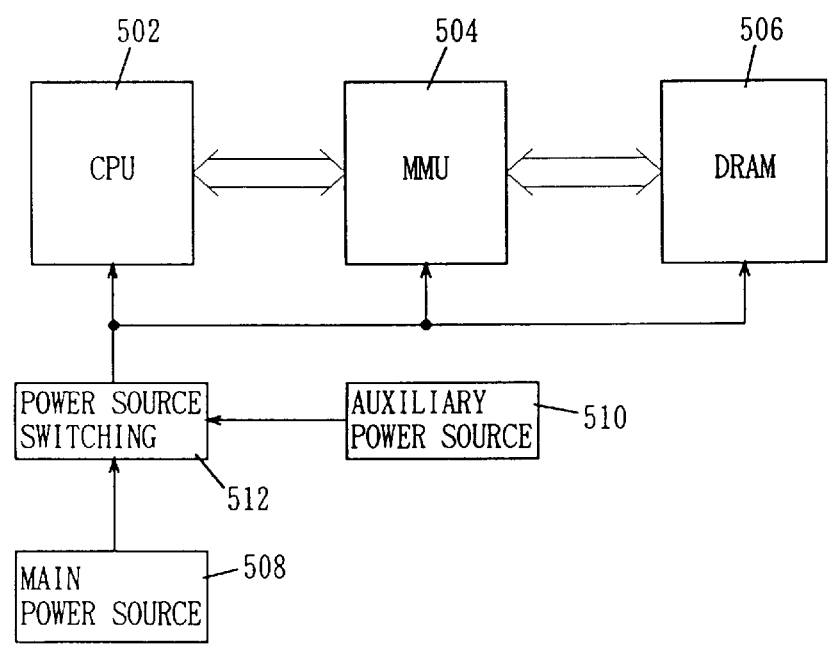
FIG. 31 is a diagram for explaining problems in the conventional data processing system.

Flipflop 306 has the same configuration as that of the flipflop shown in FIG. 24A. One-shot pulse generating circuits 402 and 404 are the same in configuration. One-shot pulse generating circuits 402 and 404 include a delay circuit (configured of inverters) delaying a signal by a predetermined time, and a gate circuit receiving the output of the delay circuit at its false input. When the signal applied to the false input is at an "L" level, and the signal applied to its true input is at an "H" level, the gate circuit generates a signal of an "H" level. The output EA of flipflop 306 is provided to an external device through the external pin terminal EPa. The output EA of flipflop 306 is also applied to ring oscillator 240 (cf. FIG. 24). The operation of the reset circuit shown in FIG. 28 will now be described with reference to FIG. 29, which is the operating waveform diagram thereof.

When the power supply voltage Vcc is lowered to a predetermined power supply voltage level or less, the signal φA rises to an "H" level. Responsively, a one-shot pulse signal is generated from one-shot pulse generating circuit 404, and flipflop 306 is brought into a set state. More specifically, the signal EA rises to an "H" level, and the self-refresh cycle is carried out.

When the power supply voltage returns to a predetermined voltage level or more, the signal φA falls to an "L" level. In this state, flipflop 306 still maintains the set state, and the signal EA maintains an "HH" level. Then, the signal /RAS is raised to an "H" level from an "L" level. In response to rising of the signal /RAS, a one-shot pulse signal is generated from one-shot pulse generating circuit 402, flipflop 306 is reset, the signal EA falls to an "L" level, and ring oscillator 240 halts the oscillating operation. An output RESET of one-shot pulse generating circuit 402 is applied to the reset input of counter circuit BC shown in FIG. 25, and the count value is reset. As a result, the self-refresh mode is released. The output RESET of one-shot pulse generating circuit 402 is also used for resetting the count value of refresh counter 242 shown in FIG. 24.

According to the configuration of the reset circuit shown in FIG. 28, it is possible to release the self-refresh mode externally. In particular, when the signal φA applied to the external pin terminal EP falls to an "L" level after the power supply voltage is lowered in a normal cycle, and the power supply voltage returns to a predetermined value or more, it is possible to release the self-refresh mode by using the externally applied control signal /RAS. In the stand-by state, when the signal /RAS is at an "H" level and the power supply voltage Vcc is decreased to a predetermined voltage level or less, even if the signal /RAS is fixed to an "H" level, self-refreshing is automatically carried out internally. In addition to this, self-refreshing is periodically carried out even after the power supply voltage returns to a predetermined voltage.

At the stand-by, it is necessary to cause the signal /RAS to fall when a new memory cycle is started. At this time, if it is structured so that an OR circuit internally receiving the signal EA and the signal /RAS is provided, and that the output of the OR circuit is applied to RAS control circuit 14 shown in FIG. 1, a self-refresh mode can be released without internal malfunction, and a new memory cycle can be reliably entered without malfunction. In this case, the OR circuit is provided in parallel with one-shot pulse generating circuit 402.

As described above, according the present invention, when the power supply voltage is lowered to a reference voltage level or less, the self-refresh mode can be automatically entered. Therefore, it is possible to carry out data holding of a memory cell accurately, and a semiconductor memory device of a high reliability without malfunction can be obtained. As a complicated timing condition of external signals such as CBR condition is not required for entering the self-refresh mode, it is possible to carry out self-refreshing with ease and with low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic type semiconductor memory device including a plurality of memory cells each having a storage data refreshed, comprising:
   voltage level detecting circuitry coupled to receive a power supply voltage and for detecting a level of the power supply voltage and generating a refresh instruct signal in accordance with the result of detection;
   refresh request circuitry including a refresh timer for generating a refresh request signal at a predetermined interval when activated, and coupled to receive said refresh instruct signal for generating said refresh request signal requesting refreshing of data of memory cells among said plurality of memory cells when said refresh instruct signal is active to instruct the refreshing;
   control circuitry coupled to receive said refresh request signal and responsive to the refresh instruct signal being active for generating a control signal required for execution of said refreshing; and
   a logic gate circuit coupled to receive an external control signal and said refresh instruct signal, for selectively disabling an output of said voltage level detecting circuitry and generating said refresh instruct signal in accordance with said external control signal.

2. The dynamic type semiconductor memory device according to claim 1, wherein said logic gate circuit includes a gate for deactivating said refresh instruct signal when said output of said voltage level detecting circuitry indicates that the refreshing should be performed and when said external control signal is set in a state instructing a refreshing.

3. The semiconductor memory device according to claim 2, wherein said logic gate circuit includes a gate for activating said refresh instruct signal when only one of said output of said voltage level detecting circuitry and said external control signal is in a state instructing the refreshing.

4. The device according to claim 1, wherein said refresh request circuitry includes said refresh timer coupled to receive said refresh instruct signal for generating said refresh request signal at predetermined intervals while said refresh instruct signal is active, and a resetter responsive to transition of said refresh instruct signal into an inactive stage for resetting said timer.

5. A dynamic type semiconductor memory device including a plurality of memory cells each having storage data refreshing, comprising;
   voltage level detecting circuitry coupled to receive a power supply voltage for detecting a level of the power supply voltage and generating a refresh instruct signal according to the result of detecting;
   refresh request circuitry coupled to receive and be responsive to said refresh instruct signal for generating a refresh request signal requesting refreshing of data of memory cells among said plurality of memory cells; and
   control circuitry coupled to receive said refresh request signal and responsive to the refresh request signal being active for generating a control signal required for execution of said refreshing, wherein said voltage level detecting circuitry includes:
   reference circuit coupled to receive said power supply voltage, for generating a reference voltage, said reference voltage being a predetermined constant voltage, less than said power supply voltage, when said power supply voltage is greater than said predetermined constant voltage, comparing circuitry coupled to receive said power supply voltage and reference voltage for comparing and differentially amplifying said power supply voltage and said reference voltage, and providing a current output signal, and a converter coupled to receive said current output for converting said current output signal into a voltage signal to generate said refresh instruct signal.

6. A dynamic type semiconductor memory device including a plurality of memory cells each having storage data refreshing, comprising;

voltage level detector coupled to receive a power supply voltage, for detecting a level of a power supply voltage and generating a refresh instruct signal according to the result of detection;

refresh request circuitry coupled to receive and be responsive to said refresh instruct signal for generating a refresh request signal requesting refreshing of data of memory cells among said plurality of memory cells; and control circuitry coupled to receive and be responsive to said refresh request signal for generating a control signal required for execution of said refreshing, wherein said voltage level detector includes:

a first voltage generator responsive to said power supply voltage for generating a first voltage signal having a predetermined constant voltage level, less than said power supply voltage level, a second voltage generator responsive to said power supply voltage for generating a second voltage signal having a level changing with said power supply voltage, and a comparator coupled to receive said first and second voltage signals for comparing said first voltage signal and said second voltage signal to generate said refresh instruct signal according to the result of comparison.

7. A dynamic type semiconductor memory device including a plurality of memory cells each having storage date refreshed, comprising;

voltage level detecting coupled to receive a power supply voltage, for detecting a level of the power supply voltage and generating a refresh instruct signal according to the result of detection;

refresh request circuitry coupled to receive and be responsive to said refresh instruct signal for generating a refresh request signal requesting refreshing of data of memory cells among said plurality of memory cells; and a controller coupled to receive and be responsive to said refresh request signal for generating a control signal required for execution of said refreshing, wherein said voltage level detecting circuitry includes;

a first gate element for transmitting a reference voltage, a second gate element for transmitting said power supply voltage, comparison circuit activated in response to an activation control signal, for comparing output voltages transmitted form said first and second gate elements, and a generator coupled to receive an output of the comparison circuit for generating said refresh instruct signal, in accordance with the output of the comparison circuit.

8. The device according to claim 7, wherein said comparison circuit has first and second nodes, respectively, receiving output voltages transmitted from first and second gate elements, and includes a latch responsive to an active state of said activation control signal for amplifying and latching the voltages at said first and second nodes, and precharge gates coupled between said first and second nodes and a node supplying said power supply voltage, and responsive to an inactive state of said activation control signal for precharging said first and second nodes to a level of said power supply voltage.

9. The device according to claim 7, wherein said activation control signal is a signal indicating a start of accessing to said device.

10. A dynamic type semiconductor memory device including a plurality of memory cells each having storage data refreshed, comprising;

a voltage level detector coupled to receive a power supply voltage for detecting a level of the power supply voltage and generating a refresh instruct signal according to the result of detection;

refresh request circuitry coupled to be responsive to said refresh instruct signal for generating a refresh request signal requesting refreshing of data of memory cells among said plurality of memory cells; and control circuitry coupled to be responsive to said refresh request signal for generating a control signal required for execution of said refreshing, wherein said voltage level detector includes;

a booster coupled to receive the power supply voltage for boosting up said power supply voltage to generate a boosted voltage signal, a reference generator coupled to receive and to be responsive to said boosted voltage signal for generating a reference voltage signal having a level independent of said power supply voltage, and a comparator coupled to receive said power supply voltage and said reference for comparing said power supply voltage and said reference voltage signal to generate said refresh request signal.

11. A dynamic type semiconductor memory device including a plurality of memory cells each having storage data refreshed, comprising;

voltage level detecting circuitry coupled to receive a power supply voltage for detecting a level of the power supply voltage and generating a refresh instruct signal according to the result of detection;

refresh request circuitry coupled to receive said refresh instruct signal for generating a refresh request signal requesting refreshing of data of memory cells among said plurality of memory cells in response to said refresh instruct signal;

control circuitry coupled to be responsive to said refresh signal for generating a control signal required for execution of said refreshing; and a terminal for externally supplying said refresh instruct signal as a signal indicating that an access to said device is inhibited.

12. A dynamic type semiconductor memory device including a plurality of memory cells each having a storage data refreshed, comprising;

voltage level detector coupled to receive a power supply voltage for detecting a level of the power supply voltage and generating a refresh instruct signal according to the result of detection;

refresh request circuitry coupled to receive and be responsive to said refresh instruct signal for generating a refresh request signal requesting refreshing of data of memory cells among said plurality of memory cells; and control circuitry coupled to receive said refresh request signal for generating a control signal required for execution of said refreshing in response to said refresh request signal, wherein said control circuitry includes an inhibition circuit coupled to be responsive to said refresh instruct signal for inhibiting an external access to said memory device.

13. A dynamic type semiconductor memory device including a plurality of memory cells each having storage data refreshing, comprising;

voltage level detecting circuitry coupled to receive a power supply voltage for detecting a level of the power supply voltage and generating a refresh instruct signal according to the result of detection;

refresh request circuitry coupled to receive refresh instruct signal for generating a refresh request signal requesting refreshing of data of memory cells among said plurality of memory cells, in response to said refresh instruct signal; and control circuitry coupled to receive said refresh request signal for generating a control signal required for execution of said refreshing in response to said refresh request signal, wherein said voltage level detecting circuitry includes a logic inversion gate coupled to receive an external signal for inverting in logic said refresh instruct signal in response to the external signal.

14. The device according to claim 13, wherein said logic inversion gate includes;

a level shifter receiving and reducing in voltage said external signal by a predetermined voltage, and an inverting gate coupled to receive said refresh instruct signal and an output signal of said level shifter for inverting in logic said refresh instruct signal when an output signal of said level shifter is not less than another predetermined voltage level.

15. A dynamic type semiconductor memory device including a plurality of memory cells each having storage data refreshed, comprising;

voltage level detecting circuitry coupled to receive a power supply voltage for detecting a level of the power supply voltage and generating refresh instruct signal according to the result of detection;

refresh request circuitry coupled to receive said refresh instruct signal for generating a refresh request signal requesting refreshing of data of memory cells among said plurality of memory cells in response to said refresh instruct signal;

control circuitry coupled to receive refresh request signal for generating a control signal required for execution of said refreshing in response to said refresh request signal; and inhibition circuitry coupled to receive an external signal exceeding a predetermined voltage level for disabling said refresh request circuitry in response to said external signal.

16. A dynamic type semiconductor memory device including a plurality of memory cells each having storage data refreshed, comprising;

voltage level detecting circuitry coupled to receive a power supply voltage for detecting a level of the power supply voltage and generating a refresh instruct signal according to the result of detection;

refresh request circuitry coupled to receive said refresh instruct signal for generating a refresh request signal requesting refreshing of data of memory cells among said plurality of memory cells in response to said refresh instruct signal; and control circuitry coupled to receive said required for execution of said refreshing in response to said refresh request signal, wherein said refresh request circuitry includes;

a clock generator activated in response to said refresh request signal for generating a clock signal, and a counter including cascaded one-bit binary counters, for counting said clock signal to generate said refresh request signal when a count thereof attains a predetermined count value, and wherein each of said cascaded one bit counters includes;

a capacitor having one electrode;

a first switching transistor coupled between the one electrode and an output node, and responsive to an output signal of a preceding stage one bit counter, for coupling said one electrode of said capacitor to the output node, a second switching transistor responsive to a potential at said one electrode of said capacitor for selectively conducting another power supply voltage, and a third switching transistor coupled between said second switching transistor and said output node, and responsive to another output signal complementary to said output signal for coupling said second switching transistor to said output node.

17. The device according to claim 16, wherein said refresh request circuitry includes a resetter responsive to transition of said refresh instruct signal into an inactive state for generating a resetting signal, and wherein each said one bit counter further includes a resetting element coupled to a corresponding output node and responsive to said resetting signal for resetting said output to an initial state.

18. A dynamic type semiconductor memory device including a plurality of memory cells each having storage data refreshed, comprising;

voltage level detector coupled to receive a power supply voltage for detecting a level of the power supply voltage and generating a refresh instruct signal according to the result of detection;

refresh request circuitry coupled to receive said refresh instruct signal for generating a refresh request signal requesting refreshing of data of memory cells among said plurality of memory cells in response to said refresh instruct signal; and control circuitry coupled to receive said refresh request signal for generating a control signal required for execution of said refreshing in response to said refresh request signal, wherein said voltage level detector includes an expanding circuit receiving said refresh instruction signal for delaying transition of said refresh instruction signal into an inactive state to effectively lengthen an active period of said refresh instruct signal.

19. The device according to claim 18, wherein said expanding circuit includes;

a setting gate responsive to said refresh instruct signal for activating said refresh request circuitry, and, a resetting gate including a clock counter and resetting said refresh request circuitry after a predetermined time period has passed since said refresh instruct signal is rendered inactive, in response to a count of said clock counter.

20. The device according to claim 18, wherein said refresh request circuitry includes a clock generator for generating a clock signal which is used for providing a timing at which said refresh request signal is generated, and wherein said expanding circuit includes;

a flip flop having an input coupled to receive said refresh instruct signal and an output set in response to said refresh instruct signal at said input, a signal generated at said output being supplies to said clock generator for activation of said clock generator, and a counter activated responsive to said signal at said output and said refresh instruct signal at inactive state for counting said clock signal to reset said signal at said output of said flip flop when the count thereof attains a predetermined count value.

21. The device according to claim 20, wherein said counter includes cascaded one bit counter each counting an input signal supplies from a one bit counter at a preceding stage, and a reset gate receiving all outputs of said cascaded one bit counter to rest said signal at said output of said flipflop when all the received signals coincide in logic with each other.

22. The device according to claim 21, wherein said counter further includes an inhibitor responsive to said reset gate resetting said flipflop for inhibiting counting operation of said cascaded one bit counters.

23. The device according to claim 18, wherein said expanding circuit includes a flipflop having an output coupled to be set in response to said refresh instruct signal and reset in response to an external signal, a signal at said output being supplies to said refresh request circuitry for activation of said refresh request circuitry.

* * * * *